United States Patent
Salcedo et al.

(10) Patent No.: US 11,004,849 B2
(45) Date of Patent: May 11, 2021

(54) DISTRIBUTED ELECTRICAL OVERSTRESS PROTECTION FOR LARGE DENSITY AND HIGH DATA RATE COMMUNICATION APPLICATIONS

(71) Applicant: Analog Devices, Inc., Norwood, MA (US)

(72) Inventors: Javier A. Salcedo, North Billerica, MA (US); Andrew Lewine, Arlington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/294,431

(22) Filed: Mar. 6, 2019

(65) Prior Publication Data

US 2020/0286889 A1 Sep. 10, 2020

(51) Int. Cl.
*H01L 27/092* (2006.01)
*H01C 7/12* (2006.01)
(Continued)

(52) U.S. Cl.
CPC .......... *H01L 27/0921* (2013.01); *H01C 7/12* (2013.01); *H01L 27/0262* (2013.01); *H01L 29/87* (2013.01)

(58) Field of Classification Search
None
See application file for complete search history.

(56) References Cited

U.S. PATENT DOCUMENTS

| | | |
|---|---|---|
| 5,610,790 A | 3/1997 | Staab et al. |
| 6,768,616 B2 | 7/2004 | Mergens et al. |
| 7,285,828 B2 | 10/2007 | Salcedo et al. |
| 7,566,914 B2 | 7/2009 | Salcedo et al. |

(Continued)

FOREIGN PATENT DOCUMENTS

| | | |
|---|---|---|
| CN | 109166850 A | 1/2019 |
| WO | WO2017078676 A1 | 5/2017 |

OTHER PUBLICATIONS

Karp et al., "FinFET MPSoC 32 Gb/s transceivers: Custom ESD protection and verification." 2016 IEEE 59th International Midwest Symposium on Circuits and Systems (MWSCAS). IEEE, 2016, in 4 pages.

*Primary Examiner* — Khaja Ahmad
(74) *Attorney, Agent, or Firm* — Knobbe, Martens, Olson & Bear, LLP

(57) ABSTRACT

Electrical overstress protection for high speed applications, such as integrated multiple subsystem communications, is provided. In certain embodiments, a semiconductor die with distributed and configurable electrical overstress protection is provided. The semiconductor die includes signal pads, a core circuit electrically connected to the signal pads, and a configurable overstress protection array operable to protect the core circuit from electrical overstress at the signal pads. The configurable overstress protection array includes a plurality of segmented overstress protection devices of two or more different device types, and both a number of selected overstress protection devices and a device type of the selected overstress protection devices is programmable. The subsystems configurations are enabled in FinFET technology. Such configurable overstress protection arrays can be distributed across the die to protect not only core circuit sub-systems at the die pads, but also between internal sub-system communication interfaces operating in different power domains.

20 Claims, 33 Drawing Sheets

(51) Int. Cl.
  *H01L 27/02*  (2006.01)
  *H01L 29/87*  (2006.01)

(56) References Cited

U.S. PATENT DOCUMENTS

| | | |
|---|---|---|
| 7,601,991 B2 | 10/2009 | Salcedo et al. |
| 8,044,457 B2 | 10/2011 | Salcedo et al. |
| 8,222,698 B2 | 7/2012 | Salcedo et al. |
| 8,320,091 B2 | 11/2012 | Salcedo et al. |
| 8,368,116 B2 | 2/2013 | Salcedo et al. |
| 8,416,543 B2 | 4/2013 | Salcedo |
| 8,422,187 B2 | 4/2013 | Parthasarathy et al. |
| 8,432,651 B2 | 4/2013 | Salcedo et al. |
| 8,466,489 B2 | 6/2013 | Salcedo et al. |
| 8,553,380 B2 | 10/2013 | Salcedo |
| 8,564,065 B2 | 10/2013 | Donovan et al. |
| 8,570,698 B2 | 10/2013 | Lee et al. |
| 8,592,860 B2 | 11/2013 | Salcedo et al. |
| 8,598,641 B2 | 12/2013 | Chen et al. |
| 8,610,251 B1 | 12/2013 | Salcedo |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,779,518 B2 | 7/2014 | Lin et al. |
| 8,796,729 B2 | 8/2014 | Clarke et al. |
| 8,860,080 B2 | 10/2014 | Salcedo |
| 8,946,822 B2 | 2/2015 | Salcedo et al. |
| 8,947,841 B2 | 2/2015 | Salcedo et al. |
| 8,958,187 B2 | 2/2015 | Parthasarathy et al. |
| 9,006,781 B2 | 4/2015 | Salcedo et al. |
| 9,088,256 B2 | 7/2015 | Cosgrave et al. |
| 9,123,540 B2 | 9/2015 | Salcedo et al. |
| 9,147,677 B2 | 9/2015 | Salcedo et al. |
| 9,171,832 B2 | 10/2015 | Salcedo et al. |
| 9,275,991 B2 | 3/2016 | Salcedo et al. |
| 9,293,912 B2 | 3/2016 | Parthasarathy et al. |
| 9,318,479 B2 | 4/2016 | Li et al. |
| 9,478,608 B2 | 10/2016 | Salcedo et al. |
| 9,634,482 B2 | 4/2017 | Parthasarathy et al. |
| 9,653,448 B2 | 5/2017 | Zhang et al. |
| 9,831,233 B2 | 11/2017 | Salcedo et al. |
| 9,876,005 B2 | 1/2018 | Su et al. |
| 10,083,952 B2 | 9/2018 | Lee et al. |
| 10,158,029 B2 | 12/2018 | Parthasarathy et al. |
| 10,177,566 B2 | 1/2019 | Zhao et al. |
| 10,199,369 B2 | 2/2019 | Parthasarathy et al. |
| 10,249,609 B2 | 4/2019 | Salcedo et al. |
| 10,340,370 B2 | 7/2019 | Wang et al. |
| 10,504,886 B1 | 12/2019 | Yam et al. |
| 2002/0089017 A1* | 7/2002 | Lai .......... H01L 29/87 257/355 |
| 2016/0056147 A1* | 2/2016 | Li .......... H01L 27/0255 257/173 |
| 2016/0204096 A1 | 7/2016 | Zhao et al. |
| 2016/0261110 A1 | 9/2016 | Ivanov et al. |
| 2016/0285255 A1 | 9/2016 | O'Donnell et al. |
| 2016/0300830 A1 | 10/2016 | Salcedo et al. |
| 2016/0336740 A1 | 11/2016 | Parthasarathy et al. |
| 2016/0336744 A1 | 11/2016 | Parthasarathy et al. |
| 2017/0069616 A1* | 3/2017 | Cai .......... H01L 29/7412 |
| 2017/0256534 A1 | 9/2017 | Parthasarathy et al. |
| 2017/0317070 A1 | 11/2017 | Salcedo et al. |
| 2018/0026440 A1 | 1/2018 | Zhao et al. |
| 2018/0158814 A1 | 6/2018 | Salcedo et al. |
| 2018/0158935 A1 | 6/2018 | Wang et al. |
| 2018/0211951 A1 | 7/2018 | Luo et al. |
| 2018/0226788 A1 | 8/2018 | Salcedo et al. |
| 2019/0027470 A1 | 1/2019 | Han et al. |
| 2019/0131787 A1 | 5/2019 | He et al. |
| 2020/0111778 A1* | 4/2020 | Lai .......... H01L 29/87 |

\* cited by examiner

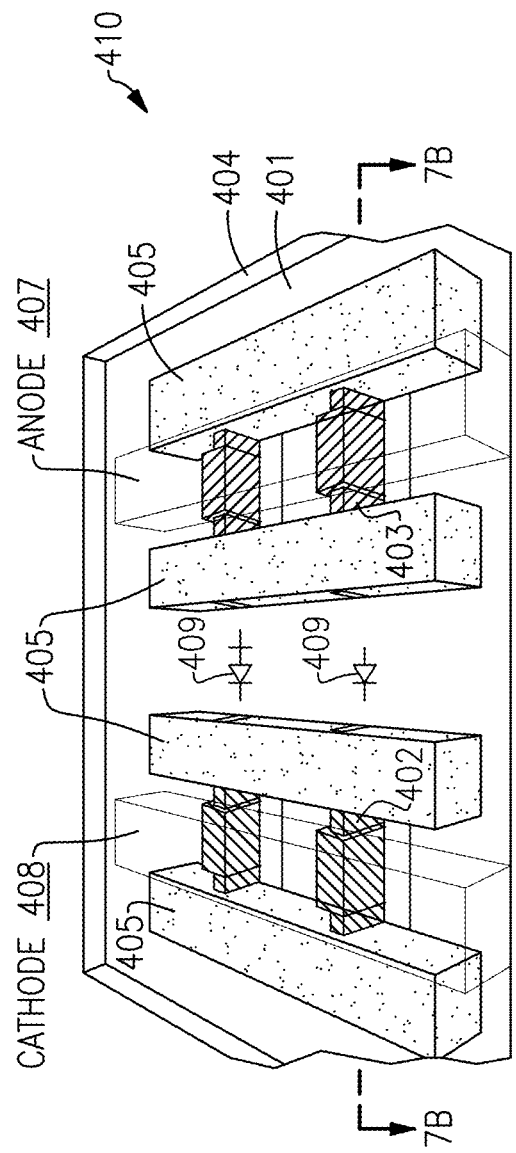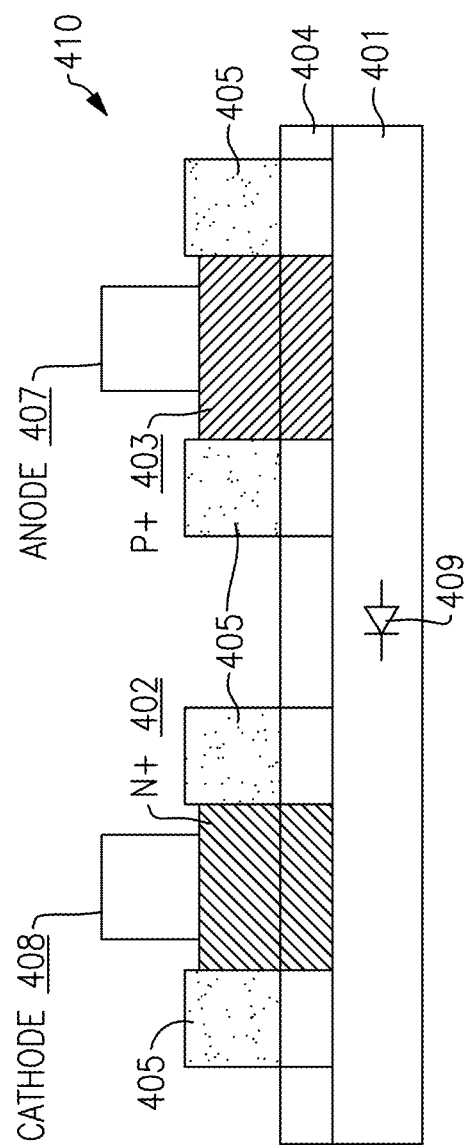

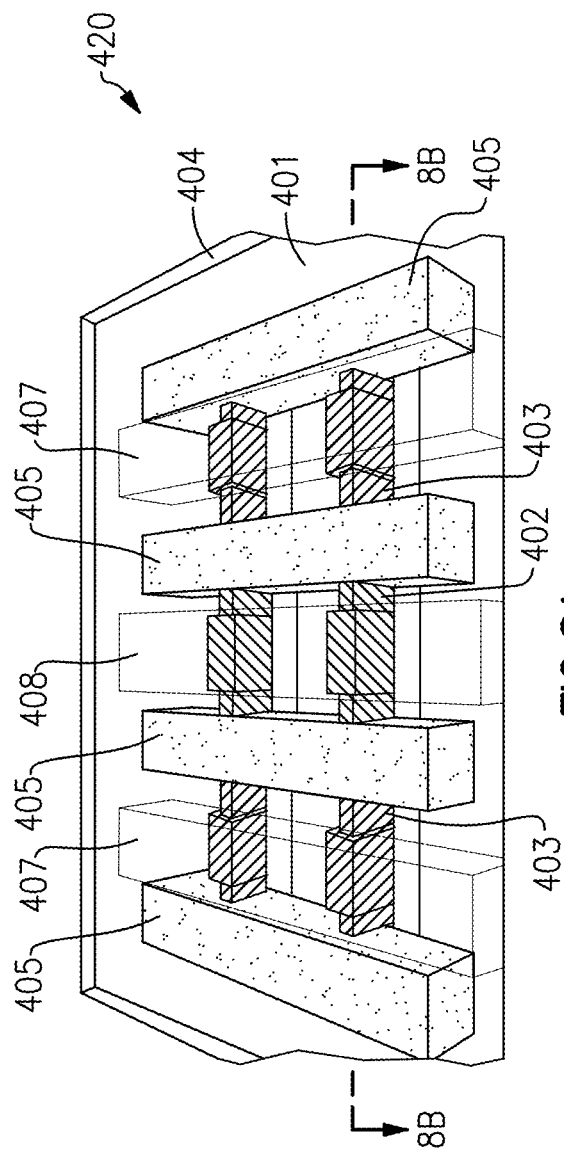
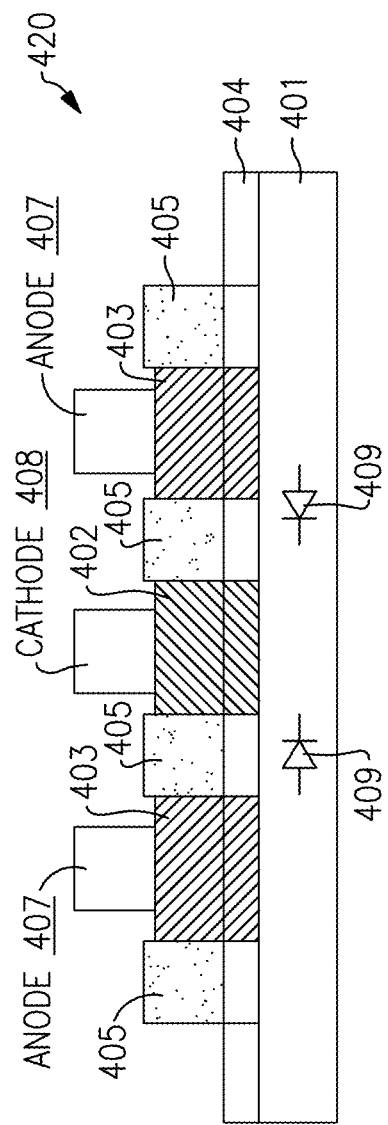
FIG. 8A
FIG. 8B

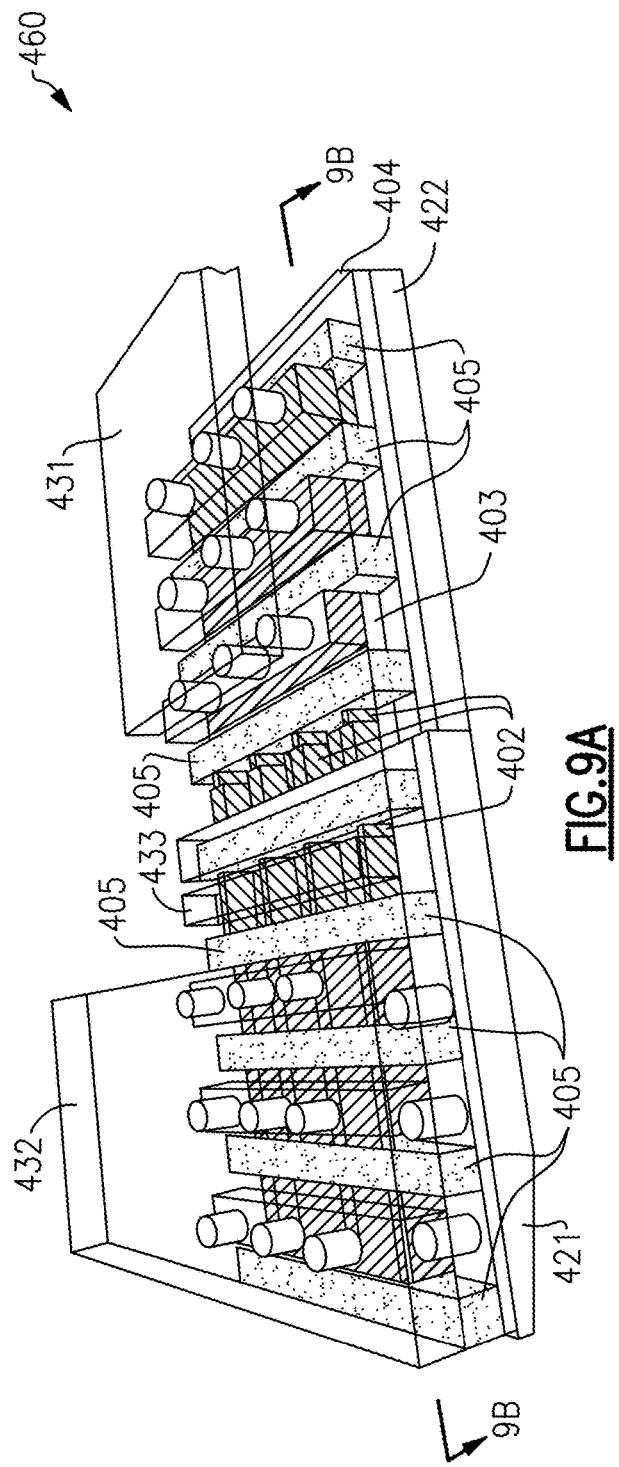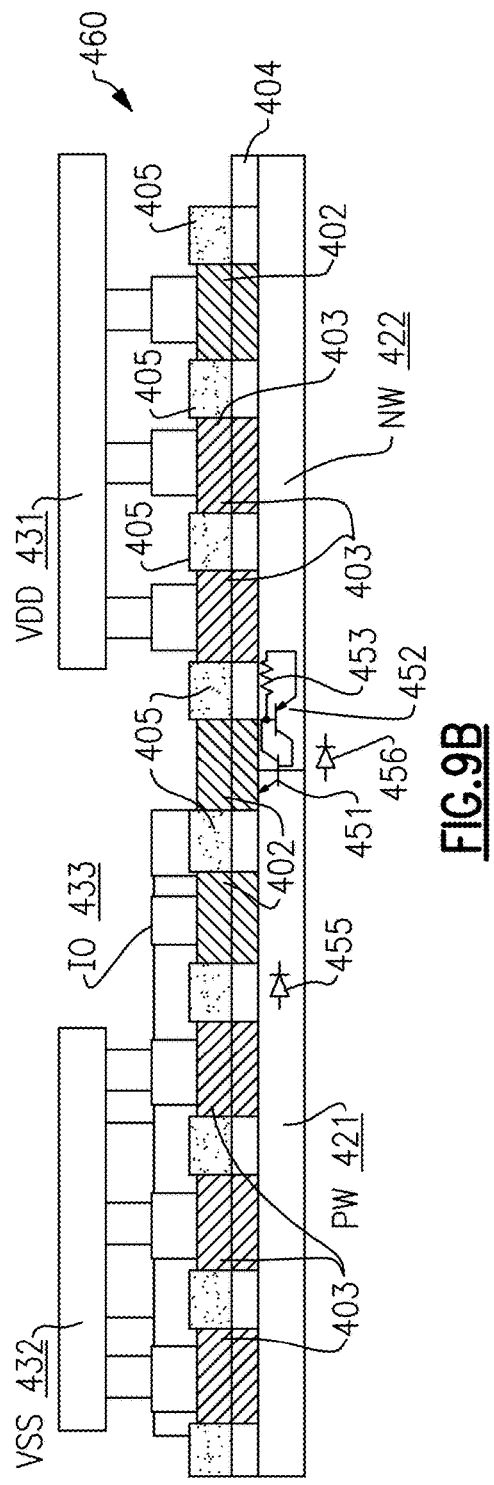
FIG.9A
FIG.9B

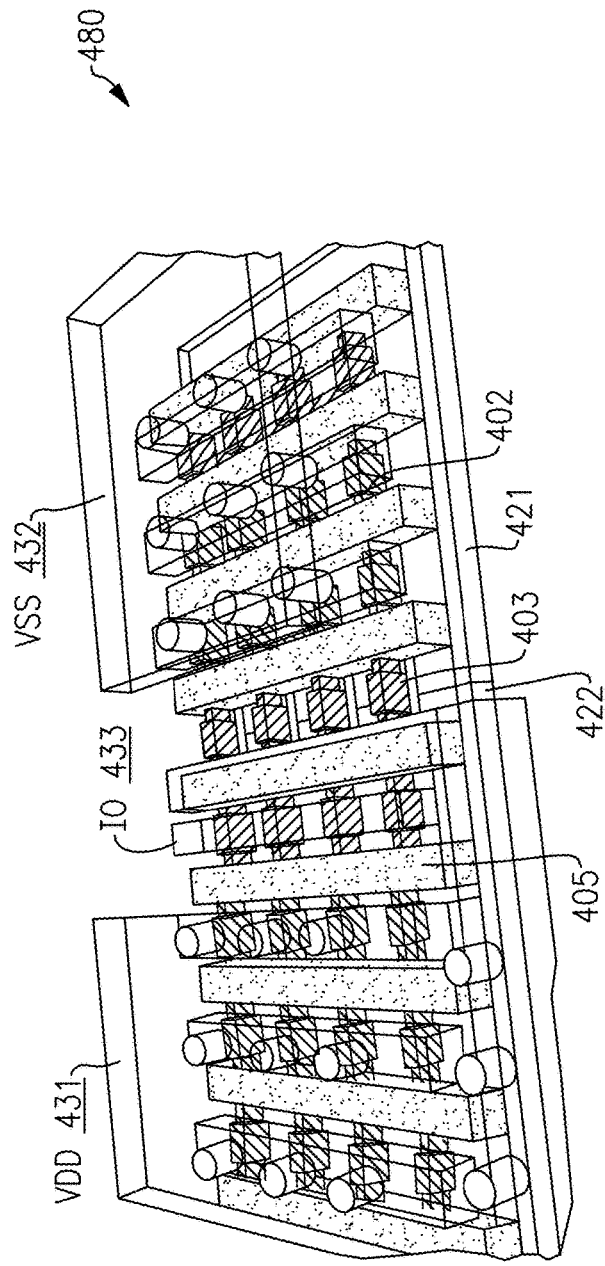
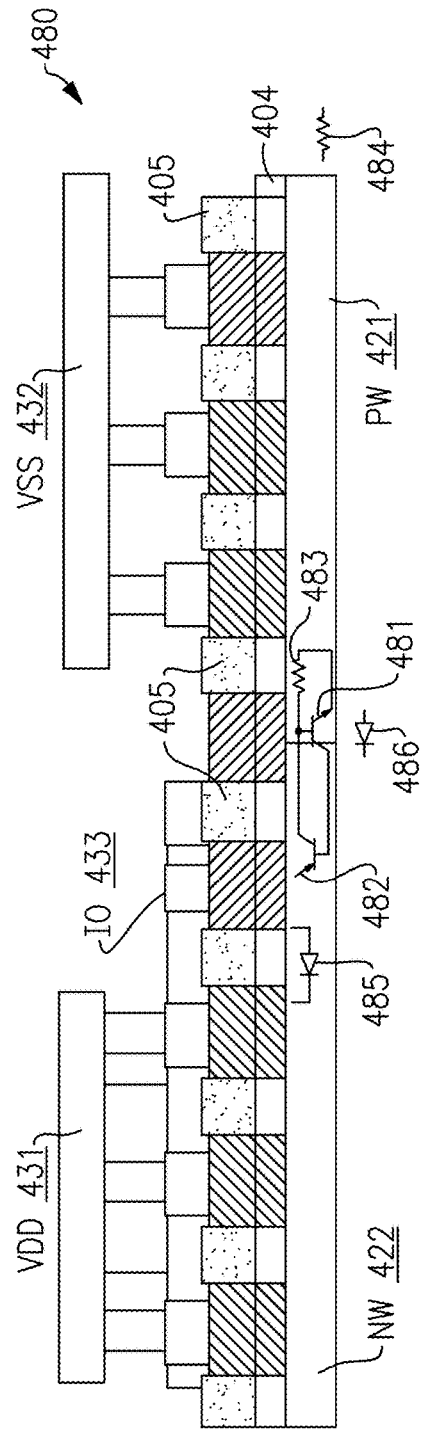
FIG.10A
FIG.10B

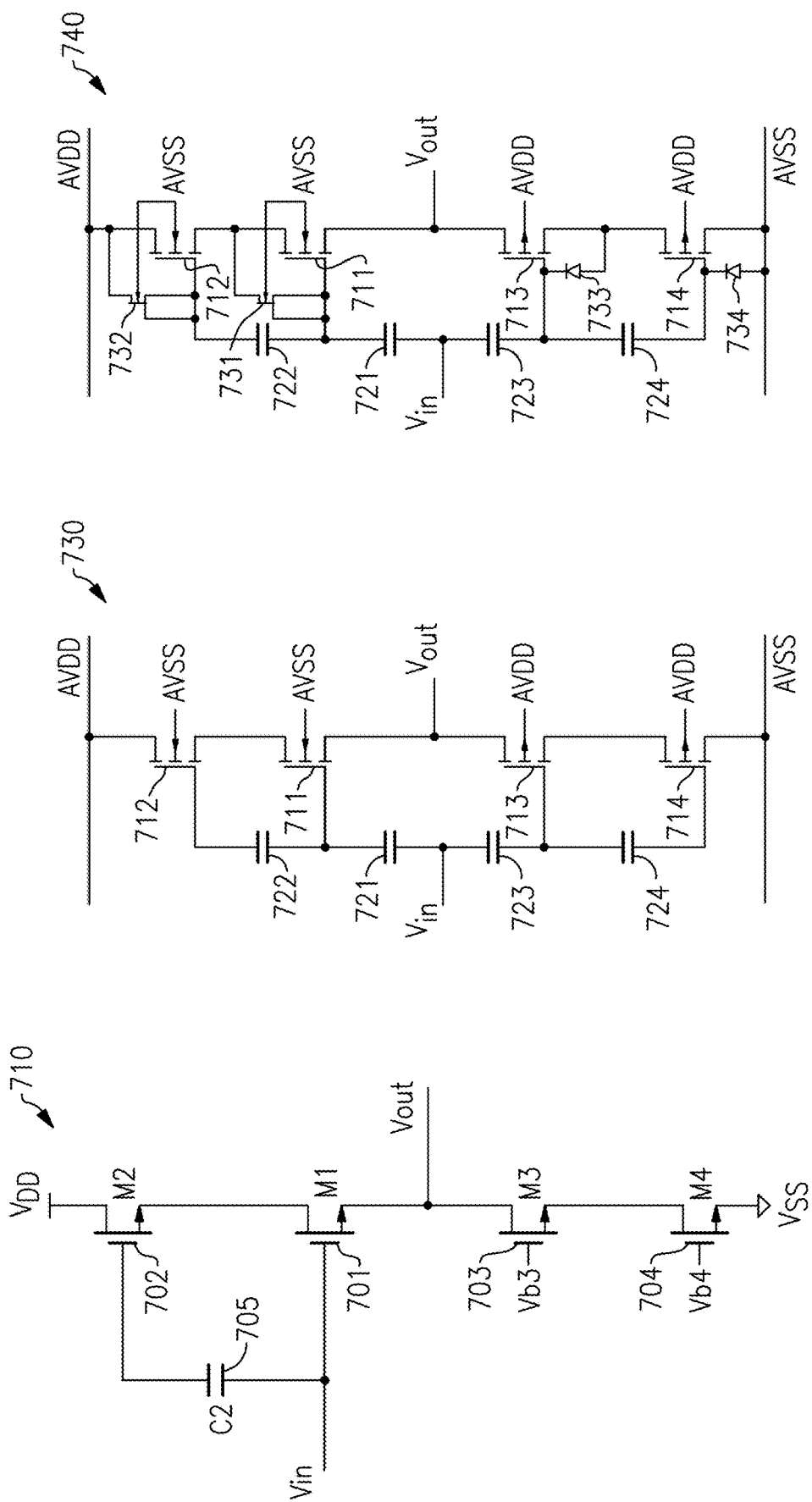

DISTRIBUTED ELECTRICAL OVERSTRESS PROTECTION FOR LARGE DENSITY AND HIGH DATA RATE COMMUNICATION APPLICATIONS

FIELD OF THE DISCLOSURE

Embodiments of the invention relate to electronic and mixed-signal high data rate communication systems, more particularly to, distributed electrical overstress protection for such systems.

BACKGROUND

Certain electronic systems can be exposed to electrical overstress events, or electrical signals of short duration having rapidly changing voltage and high power. Electrical overstress events include, for example, electrical overstress (EOS) and electrostatic discharge (ESD) arising from the abrupt release of charge from an object or person to an electronic system.

Electrical overstress events can damage or destroy integrated circuits (ICs) by generating overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY OF THE DISCLOSURE

Electrical overstress protection for high speed applications, such as integrated multiple subsystem communications, is provided. In certain embodiments, a semiconductor die with distributed and configurable electrical overstress protection is provided. The semiconductor die includes signal pads, a core circuit electrically connected to the signal pads, and a configurable overstress protection array operable to protect the core circuit from electrical overstress at the signal pads. The configurable overstress protection array includes a plurality of segmented overstress protection devices of two or more different device types, and both a number of selected overstress protection devices and a device type of the selected overstress protection devices is programmable. Such configurable overstress protection arrays can be distributed across the die to protect not only core circuit sub-systems at the die pads, but also between internal sub-system communication interfaces operating in different power domains.

In one aspect, a semiconductor die with distributed and configurable electrical overstress protection is provided. The semiconductor die includes a plurality of pads including a signal pad, a power high pad, and a power low pad, and a core circuit electrically connected to at least the signal pad, the power high pad, and the power low pad. The semiconductor die further includes a configurable overstress protection array operable to protect the core circuit from electrical overstress at the plurality of pads. The configurable overstress protection array includes a plurality of overstress protection devices of two or more different device types, wherein both a number of selected overstress protection devices and a device type of the selected overstress protection devices is programmable.

In another aspect, a method of distributed and customizable electrical overstress protection for a semiconductor die is provide. The method includes configuring a heterogeneous overstress protection array, including selecting a number of segmented overstress protection devices from a plurality of available overstress protection devices. The method further includes choosing a device type of the selected segmented overstress protection devices from amongst two or more different device types providing complementary protection characteristics. The method further includes protecting a core circuit from electrical overstress using the selected segmented overstress protection devices, the core circuit electrically connected to at least a signal pad, a power high pad, and a power low pad.

In another aspect, an electrical interface for a semiconductor die is provided. The electrical interface includes a plurality of pads including a signal pad, a power high pad, and a power low pad, and a core circuit electrically connected to at least the signal pad, the power high pad, and the power low pad. The electrical interface further includes means for customizing a number of and type of segmented overstress protection devices for protecting the core circuit.

In another aspect, an electrical interface for a semiconductor die is provided. The electrical interface includes a plurality of pads including a signal pad, a power high pad, and a power low pad, a first core circuit electrically connected to at least the signal pad, the power high pad, and the power low pad, and a second core circuit electrically connected to the first core circuit over an internal interface. The electrical interface further includes a configurable overstress protection array implemented such that a number of and type of segmented overstress protection devices for protecting the core circuit is programmable. The configurable overstress protection array is operable to provide protection to both the first core circuit at the plurality of signal pads and at internal interface.

BRIEF DESCRIPTION OF THE DRAWINGS

FIG. 7A is a perspective view of a FinFET diode with shallow trench isolation (STI) inter-active isolation according to one embodiment.

FIG. 7B is a cross-section of the FinFET diode of FIG. 7A taken along the lines 7B-7B.

FIG. 8A is a perspective view of a FinFET diode with fin gates inter-active isolation according to one embodiment.

FIG. 8B is a cross-section of the FinFET diode of FIG. 8A taken along the lines 8B-8B.

FIG. 9A is a perspective view of a FinFET silicon controlled rectifier (SCR) according to one embodiment.

FIG. 9B is a cross-section of the FinFET SCR of FIG. 9A taken along the lines 9B-9B.

FIG. 10A is a perspective view of a FinFET SCR according to another embodiment.

FIG. 10B is a cross-section of the FinFET SCR of FIG. 10A taken along the lines 10B-10B.

FIG. 12A is a schematic diagram of a receiver circuit according to one embodiment.

FIG. 12B is a schematic diagram of a receiver circuit according to another embodiment.

FIG. 12C is a schematic diagram of a receiver circuit according to another embodiment.

DETAILED DESCRIPTION

Figure 1:
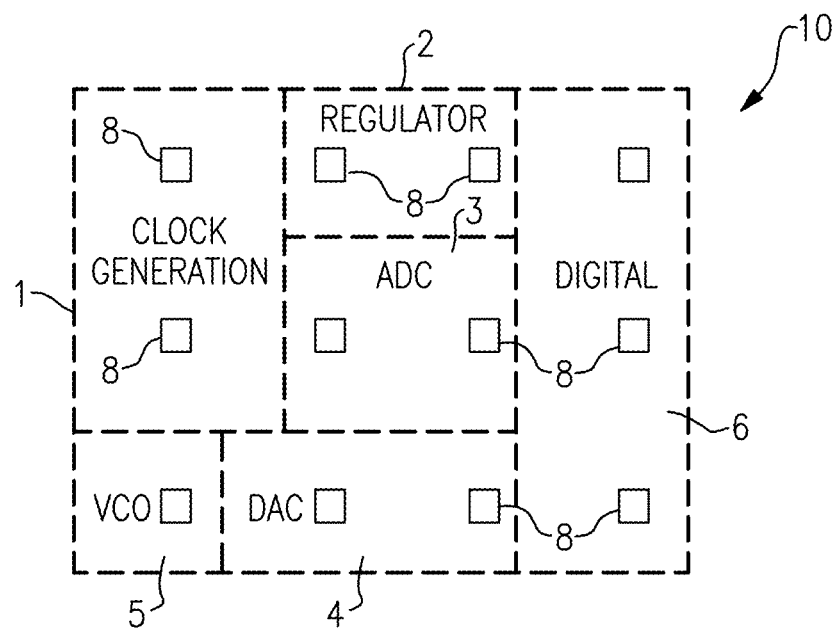
FIG. 1 is a high-level distributed sub-system layout plan of a radio communications integrated circuit according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Certain electronic systems include overstress protection circuits to protect circuits or components from electrical overstress events. To help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of electrical overstress events, including electrical overstress (EOS) and/or electrostatic discharge (ESD).

FIG. 1 is a high-level distributed sub-system layout plan of a radio communications integrated circuit or IC 10 according to one embodiment. The IC 10 includes a clock generation circuit 1, a regulator 2, an analog-to-digital converter (ADC) 3, a digital-to-analog converter (DAC) 4, a voltage controlled oscillator (VCO) 5, a digital processing circuit 6, and various pins or pads 8. The pads 8 correspond to an electrical interface for the IC 10, which allows the IC 10 to receive power and to communicate with external electronics. The IC 10 is also referred to herein as a semiconductor die or chip.

The IC 10 is implemented using modular circuits that are placed in various desired positions of the chip floorplan or layout during design of the chip. For instance, a computer aided design (CAD) library can include circuit layouts of various circuit blocks that provide a wide range of functions, such as clock generation, power management (for instance, voltage regulation), data conversion, digital processing, and/or a variety of other functions. During design of the chip, a desired combination of circuit blocks are positioned or arranged around the chip floorplan and interconnected to achieve desired chip functionality. Additionally, the resulting chip design is provided to a foundry, which fabricates semiconductor chips in accordance with the chip design.

As shown in FIG. 1, an example placement of various modular components has been depicted. Although an example with the clock generation circuit 1, the regulator 2, the ADC 3, the DAC 4, the VCO 5, and the digital processing circuit 6 has been shown, other combinations of circuit blocks and/or block placements are possible.

Although implementing an IC using a modular design library can reduce costs and/or design time by streamlining a design flow and/or helping circuit designers in achieving a desired chip functionality, such a modular design flow can present challenges in providing protection against electrical overstress.

For example, as shown in FIG. 1, the placement of pads 8 to underlying circuitry can vary based on an area, shape, and/or choice of modular circuit blocks for a particular design. Furthermore, such circuit blocks can operate with different power domains (for instance, different power supply voltage levels), which can give rise to electrical overstress considerations between one power domain and another power domain.

Moreover, in high performance applications, such as signaling in high speed wireless communications, the performance of core circuitry connected to an IC's pads can be impacted by loading effects (including, but not limited to, parasitic capacitance and/or leakage current) of electrical overstress protection circuitry connected to the IC's pads. In such applications it may not be feasible to overdesign the electrical overstress protection circuitry to provide suitable protection for a worst case scenario or placement of the modular circuit blocks relative to one another and/or relative to the chip's pads.

The teachings herein can provide flexibility to electrical overstress protection circuitry that can aid in providing customizable electrical overstress protection suitable for a particular selection and/or placement of modular circuit blocks. For example, metallization, fuses, switches, and/or other configuration structures can be used to control various parameters of electrical overstress protection circuitry, such as forward trigger voltage, forward holding voltage, reverse trigger voltage, reverse holding voltage, leakage current, capacitive loading, type of protection element, current handling capability, and/or other characteristics.

Figure 2A:
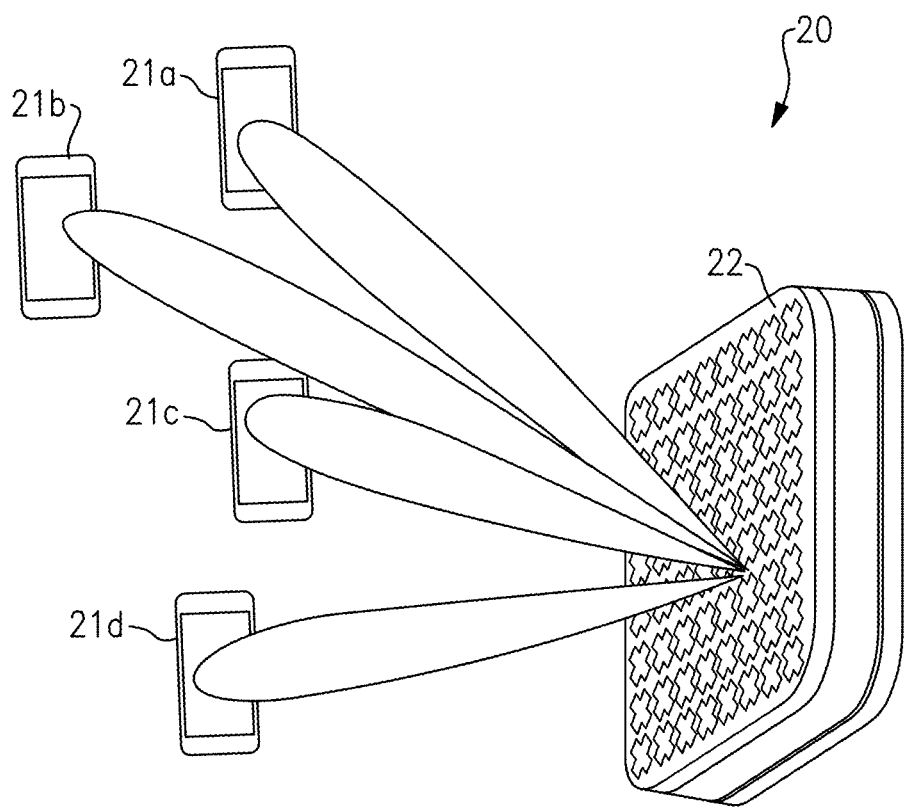
FIG. 2A is a schematic diagram of one example of a communication wireless cellular network.

FIG. 2A is a schematic diagram of one example of a communication wireless cellular network or wireless network 20. The wireless network 20 illustrates a portion of a high speed wireless network, such as a fifth generation (5G) network. In this example, the wireless network 20 includes a network access point 22, such as a base station. Additionally, the wireless network 20 includes various examples of user equipment (UE), such as a first mobile device 21a, a second mobile device 21b, a third mobile device 21c, and a fourth mobile device 21d.

Although illustrated with one network access point and four mobile devices, the wireless network 20 can include additional network access points and/or mobile devices.

Furthermore, although an example with mobile devices is depicted, the wireless network 20 can operate with other types of UE, such as tablets, customer premises equipment, computers, vehicles, internet of things (IOT) devices, and/or a wide range of wireless-enabled devices. Moreover, the wireless network 20 can include network access points of a wide range of numbers and/or types, including, but not limited to, macro cell base stations and/or small cell base stations (for instance, an access point for a femtocell, a picocell, and/or a microcell).

The wireless network 20 can serve a wide range of use cases, such as enhanced mobile broadband (eMBB), massive machine type connectivity (mMTC), and/or ultra reliable low latency communications (uRLLC).

To enhance higher data throughput and/or higher network capacity, the UE and/or network access points of the wireless network 20 can operate with a range of features, such as massive multiple input multiple output (MIMO), beamforming, and/or complex signal waveforms with wide bandwidth and/or high peak-to-average power ratio (PAPR). Moreover, communication frequencies of the wireless network 20 can include not only lower radio frequencies (for instance, radio frequencies up to about 3 GHz), but also communications using centimeter waves (from about 3 GHz to about 30 GHz) and/or millimeter waves (from about 30 GHz to about 300 GHz).

In certain implementations, UE and/or network access points (for instance, base stations) are implemented with electrical overstress protection circuitry in accordance with the teachings herein. For example, the electrical overstress protection circuitry herein provides configurability of various protection characteristics to aid in achieving a suitable level of protection for high speed signaling pins that are sensitive to loading effects and/or operating characteristics of electrical overstress protection circuitry.

For example, the teachings herein provide electrical overstress protection that is customizable using metallization, fuses, switches, and/or other configuration structures. Thus, flexibility is provided for controlling various overstress protection characteristics, including, but not limited to, forward trigger voltage, forward holding voltage, reverse trigger voltage, reverse holding voltage, leakage current, capacitive loading, type of protection element, and/or current handling capability.

Figure 2B:
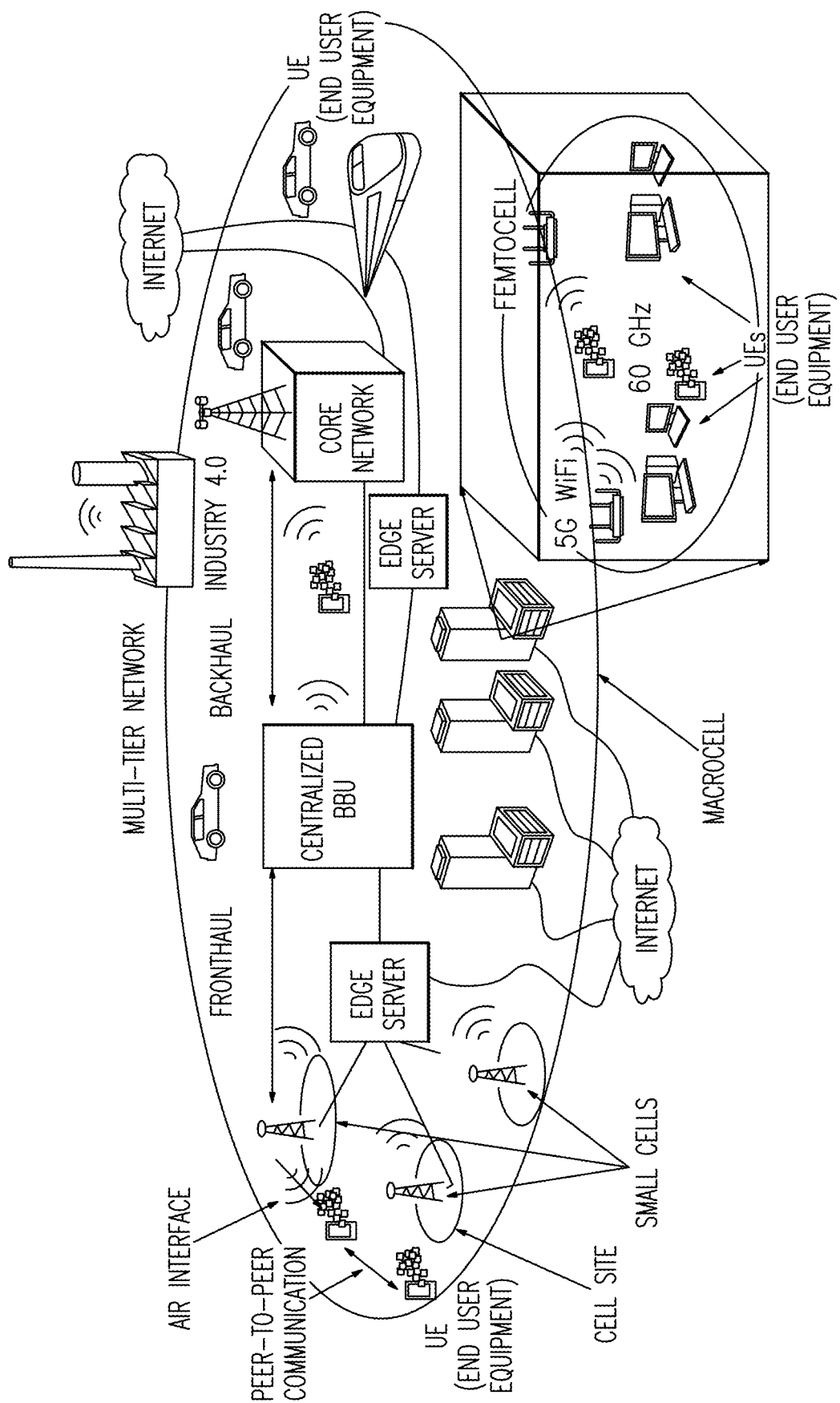
FIG. 2B is a schematic diagram of one example of a multi-tier high speed data communication network ecosystem.

FIG. 2B is a schematic diagram of one example of a multi-tier high speed data communication network ecosystem including, for instance, different mobile end users, industry 4.0 ecosystem support, and autonomous driving communication infrastructure. This supports artificial intelligence data communication and real time fast decision making process, as well as secure close-loop networks.

Wireless data traffic has been increasing at a rate of over 50% per year per subscriber, and this trend is expected to accelerate over the next decade with the continual use of video and the rise of IoT. To address this demand, 5G technology plans to use millimeter wave frequencies to expand available frequency spectrum and provide multi-Gigabit-per second (Gbps) data rates to mobile devices and other UE. 5G promises great flexibility to support a myriad of Internet Protocol (IP) devices, small cell architectures, and/or dense coverage areas.

Current or planned applications for 5G include, but are not limited to, Tactile Internet, vehicle-to-vehicle (V2V) communication, vehicle-to-infrastructure (V2I) communication, peer-to-peer communication, and/or machine-to-machine communication, close loop secured communication and external artificial intelligence data processing services on the cloud. Such technologies utilize high data rate and/or low network latency. For example, certain applications, such as V2V communication and/or remote surgery, must operate with low latency to ensure human safety.

In the multi-tier network of FIG. 2B, existing cellular network is evolving to support 5G, where WiFi off-loading, small cells, and/or distribution of wideband data utilizes servers at the edges of the network (edge servers) to enable new use cases with lower latency. As shown in the example of FIG. 2B, backhaul connects fixed cellular infrastructure to the core telephone network and the Internet. Thus, backhaul carries traffic between the local subnetwork (for instance, connections between UE and network access points, such as base stations) and the core network (for instance, the Internet and Mobile Switching Telephone Office). The multi-tier network of FIG. 2B is also implemented to operate using Industry 4.0, thereby enabling augmented reality and/or real-time artificial intelligence (AI) over the cloud.

With continuing reference to FIG. 2B, the illustrated multi-tier architecture utilizes larger coverage fourth Generation (4G) cells with an underlying network of closer-spaced 5G base stations. Implementing the multi-tier network of FIG. 2B in this manner provides a number of advantages, including flexibility in providing different tiers of channel access priority for different kinds of connections. For example, macrocells, small cells, and/or device-to-device connections can operate with varying priorities for channel access.

One way to increase area spectral efficiency is to shrink cell size, thereby reducing the number of users per cell and provided additional spectrum to each user. Thus, total network capacity increases by shrinking cells and reusing spectrum.

Along with the aforementioned technology capabilities, there are important reliability considerations in these type of high data communication mission-critical applications to be addressed, including capability of the communication subsystems to tolerate stochastic electrical overstress that can be induced randomly during manufacturing and field applications, increasingly critical for field-induced electrical overstress. Thus, to achieve advanced integration of multifunction radio systems (for instance, integration into a single chip) high levels of robustness to electrical overstress are important. The communication subsystems can be distributed in separate functions blocks and can also be programmable and include a greater functionality within a single die for more advanced manufacturing technologies.

The teachings herein can provide flexibility to electrical overstress protection circuitry that can aid in providing customizable electrical overstress protection suitable for high speed interfaces of wireless communication devices operating in a multi-tier network. For example, metallization, fuses, switches, and/or other configuration structures can be used to control various parameters of electrical overstress protection circuitry. Such flexibility facilitates protection of sensitive circuitry in high speed applications from damage arising from electrical overstress, thereby helping to realize the multi-tier network of FIG. 2B.

Figure 2C:
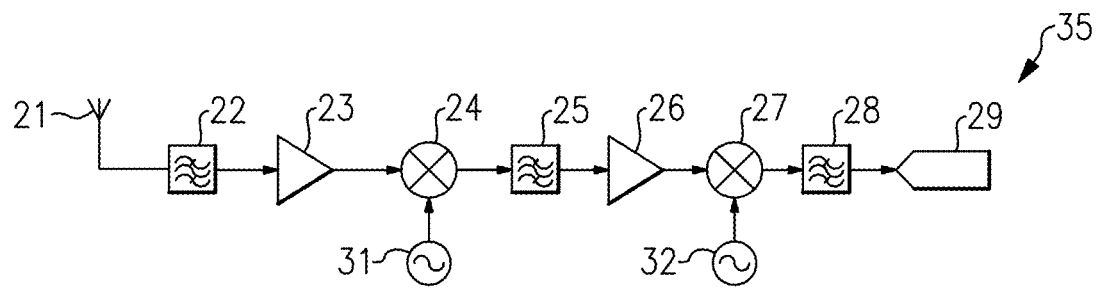
FIG. 2C is a schematic diagram of one example of discrete functional blocks of a radio frequency (RF) receiver data communication system for a wireless network.

FIG. 2C is a schematic diagram of one example of discrete functional blocks of a radio frequency (RF) receiver data communication system 35 for a wireless network. The RF receiver 35 includes an antenna 21, an RF filter 22, a low noise amplifier (LNA) 23, an RF to intermediate frequency (IF) mixer 24, an IF filter 25, an IF amplifier 26, an IF to baseband mixer 27, a baseband filter 28, an ADC 29, a first local oscillator (LO) 31, and a second LO 32.

The RF receiver 35 illustrates one example of a dual conversion receiver suitable for providing, for instance, bandwidth of a few hundred kilohertz (kHz).

Figure 2D:
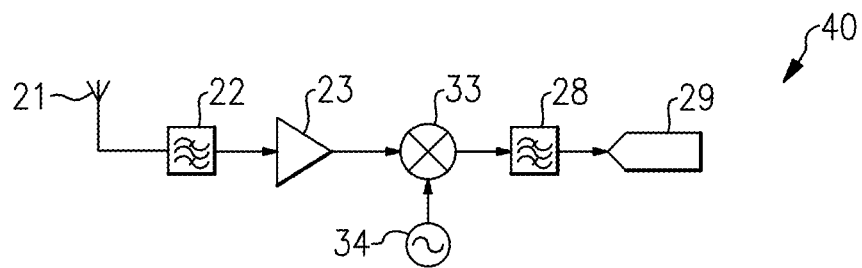
FIG. 2D is a schematic diagram of another example of discrete functional blocks of an RF receiver data communication system for a wireless network with more integration of intermediate mixing and buffering as compared with the system of FIG. 2C.

FIG. 2D is a schematic diagram of another example of discrete functional blocks of an RF receiver data communication system 40 for a wireless network with more integration of intermediate mixing and buffering as compared with the system of FIG. 2C. The RF receiver 40 includes an antenna 21, an RF filter 22, an LNA 23, a low pass filter 28, an ADC 29, a mixer 33, and an LO 34.

The RF receiver 40 illustrates one example of a single conversion receiver suitable for providing, for instance, bandwidth of a few hundred megahertz (MHz).

Figure 2E:
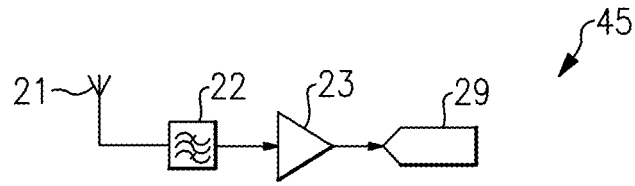
FIG. 2E is a schematic diagram of another example of discrete functional blocks of an RF receiver data communication system for a wireless network with full integration of intermediate mixing and buffering into just two functional subsystems to enhance compactness as compared with the system of FIG. 2D.

FIG. 2E is a schematic diagram of another example of discrete functional blocks of an RF receiver data communication system 45 for a wireless network with full integration of intermediate mixing and buffering into just two functional subsystems to enhance compactness as compared with the system of FIG. 2D. The RF receiver 45 includes an antenna 21, an RF filter 22, an LNA 23, and an ADC 29.

The RF receiver 45 illustrates one example of a direct conversion receiver suitable for providing, for instance, bandwidth of several hundred megahertz.

Figure 2F:
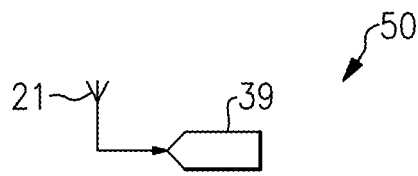
FIG. 2F is a schematic diagram of an example of a fully integrated software-programmable data communication and radio system for a multi-input multi-output (MIMO) wireless network.

FIG. 2F is a schematic diagram of an example of a fully integrated software-programmable data communication and radio system 50 for a multi-input multi-output (MIMO) wireless network. The RF receiver 50 includes an antenna 21 and a wide bandwidth ADC 39. As skilled artisans will appreciate, MIMO is a communication technique for multiplying the capacity of a radio link using multiple transmitting and receiving antennas to exploit multipath propagation.

The RF receiver 50 illustrates one example of a software-defined receiver suitable for providing, for instance, bandwidth on the order of tens of gigahertz (GHz).

Figure 2G:
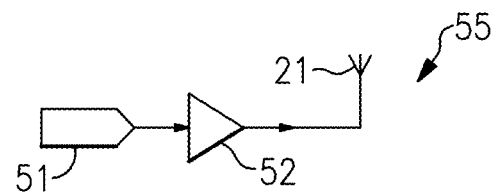
FIG. 2G is a schematic diagram of one example of a fully integrated RF data converter (digital-to-analog) output system for a wireless network.

FIG. 2G is a schematic diagram of one example of a fully integrated RF data converter (digital-to-analog) output system 55 for a wireless network. The output system or RF transmitter 55 includes an antenna 21, a wide bandwidth DAC 51, and a power amplifier (PA) 52.

With reference to FIGS. 2C-2G, although reducing a number of components in a transmit chain and/or receive chain of an RF communication system can increase bandwidth, implementing an RF communication system in this manner can raise challenges in the implementation of data converter circuitry. For example, high speed circuitry can be used in the wide bandwidth ADC 39 of FIG. 2F and/or the wide bandwidth DAC 51 of FIG. 2G to achieve tens of gigahertz of bandwidth.

The electrical overstress protection circuitry herein provides configurability in various protection characteristics to aid in achieving a suitable level of protection for high speed circuitry that is sensitive to loading effects and/or operating characteristics of the electrical overstress protection circuitry. Wide bandwidth ADCs and/or wide bandwidth DACs provide another example of high speed circuitry that is sensitive to electrical overstress protection circuitry. The teachings herein can be used to protect sensitive circuitry in high speed applications from damage arising from electrical overstress.

Figure 3:
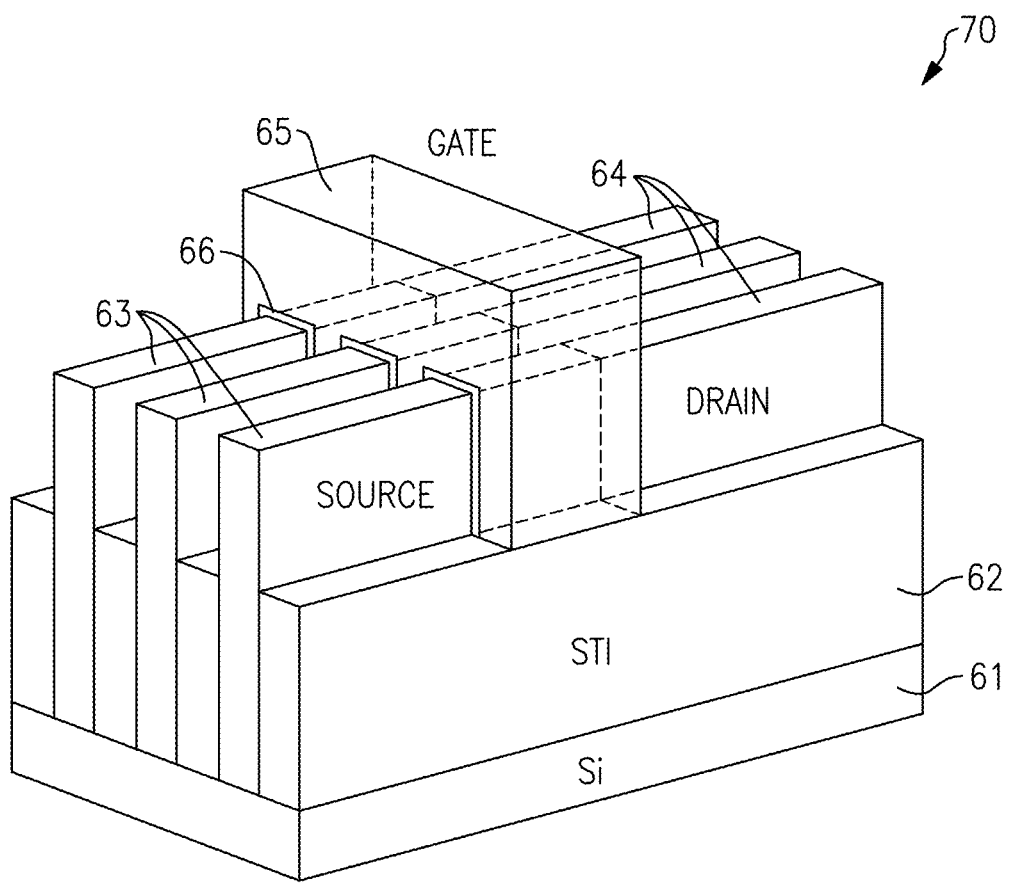
FIG. 3 is a perspective view of a fin field-effect transistor (FinFET) according to one embodiment.

FIG. 3 is a perspective view of a fin field-effect transistor (FinFET) 70 according to one embodiment. The FinFET 70 is fabricated in a silicon (Si) substrate 61, and includes shallow trench isolation (STI) regions 62, source fins 63, drain fins 64, a gate 65, and a high-k metal gate (HKMG) region 66.

The FinFET 70 can provide a number of advantages relative to other transistor technologies. For example, the FinFET 70 can provide higher electrical control over a channel, more effective leakage suppression, enhanced driving current, and/or higher intrinsic gain for superior analog performance.

Thus, the FinFET 70 provides a number of advantages suitable for deployment in ICs for high speed data conversion, wide bandwidth wireless communications, and/or other high performance applications. For example, a semiconductor chip implemented with FinFETs can be used to enable the high speed applications discussed above with reference to FIGS. 1-2G.

Although FinFET technology can provide a number of advantages, such FinFETs can operate with higher parasitic resistance, higher parasitic capacitance, and/or poorer thermal characteristics (for instance, higher thermal impedance and/or more self-heating) relative to transistors fabricated using a conventional complementary metal oxide semiconductor (CMOS) process. Such characteristics can render FinFETs susceptible to damage from electrical overstress.

The teachings herein can be used to provide configurability to electrical overstress protection circuitry for ICs fabricated using FinFET technologies, thereby helping to meet tight design windows for robustness. Although the teachings herein are applicable to FinFET processes, the teachings herein are also applicable to other types of processing technologies.

Electrical Overstress Protection for High Speed Applications

Figure 4:
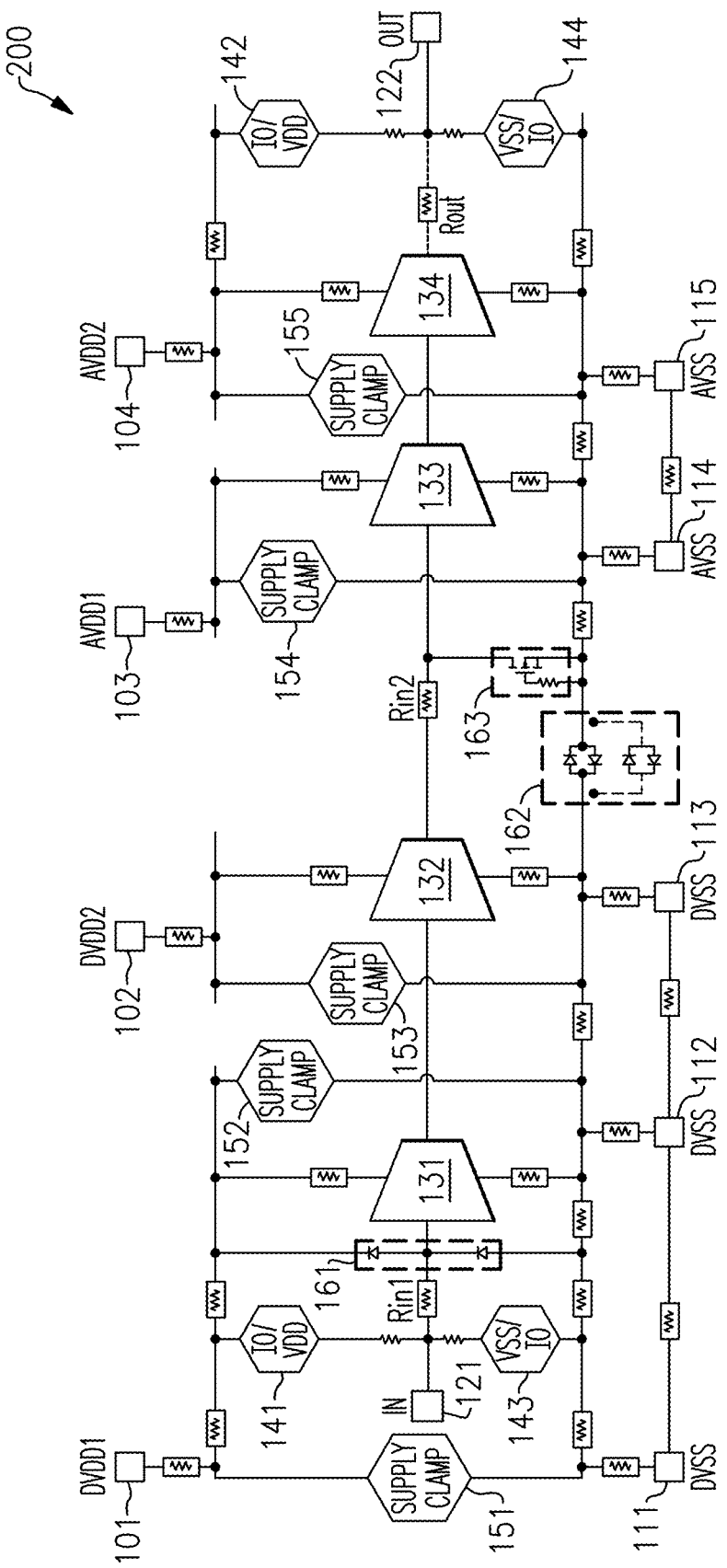
FIG. 4 is a schematic diagram of a chip interface with distributed electrical overstress protection according to one embodiment.

FIG. 4 is a schematic diagram of a chip interface 200 with distributed electrical overstress protection according to one embodiment.

The chip interface 200 includes a variety of pins or pads, including a first power high pad 101 for a first digital circuit domain (DVDD1), a second power high pad 102 for a second digital circuit domain (DVDD2), a third power high pad 103 for a first analog circuit domain (AVDD1), a fourth power high pad 104 for a second analog circuit domain (AVDD2), a first power low or ground pad 111 for the digital circuit domains (DVSS), a second power low pad 112 for the digital circuit domains, a third power low pad 113 for the digital circuit domains, a fourth power low pad 114 for the analog circuit domains (AVSS), a fifth power low pad 115 for the analog circuit domains, an input signal pad 121 (IN), and an output signal pad 122 (OUT). Although one example of pads is shown, a chip interface can include a wide range of types of pads, including, but not limited to, input and/or output (IO) pads, power supply pads, and/or ground pads. Although a particular number of pads is shown, more or fewer pads can be included and/or a different arrangement of pads can be used.

In the illustrated embodiment, the chip interface 200 further includes a first digital circuit 131, a second digital circuit 132, a first analog circuit 133, a second analog circuit 134, a primary forward overstress protection circuit 141 for the input signal pad 121, a primary reverse overstress protection circuit 143 for the input signal pad 121, a primary forward overstress protection circuit 142 for the output signal pad 122, a primary forward overstress protection circuit 144 for the output signal pad 122, a supply clamp 151 and a supply clamp 152 for the first digital circuit domain, a supply clamp 153 for the second digital circuit domain, a supply clamp 154 for the first analog circuit domain, a supply clamp 155 for the second analog circuit domain, a secondary overstress protection circuit 161 for the input signal pad 121, a cross-domain power low overstress protection circuit 162, and a cross-domain secondary overstress protection circuit 163. Furthermore, various resistors are shown, including an input resistor Rin1 to the first digital circuit 131, an input resistor Rin2 to the first analog circuit 133, an output resistor Rout to the output signal pad 122, and various resistors associated with resistances of metallization used in routing the power supplies throughout the chip interface 200. Although one example of circuits for a chip interface is shown, a chip interface can include a wide range of types and/or numbers of circuits. Accordingly, other implementations are possible.

The chip interface 200 of FIG. 4 illustrates one embodiment of a chip interface that can be implemented in accordance with one or more features of the present disclosure.

In a first example, the primary forward overstress protection circuit 141 and/or the primary reverse overstress protection circuit 143 for the input signal pad 121 is implemented using a configurable overstress protection array. For example, the configurable overstress protection arrays of FIG. 5 and/or FIG. 6A can be used to implement the primary forward overstress protection circuit 141 and/or the primary reverse overstress protection circuit 143. Accordingly, customizable overstress protection can be provided to the input signal pad 121, thereby preventing the first digital circuit 131 from being damaged.

In a second example, the primary forward overstress protection circuit 142 and/or the primary reverse overstress protection circuit 144 for the output signal pad 122 is implemented using a configurable overstress protection array. For example, the configurable overstress protection arrays of FIG. 5 and/or FIG. 6A can be used to implement the primary forward overstress protection circuit 142 and/or the primary reverse overstress protection circuit 144. Accordingly, customizable overstress protection can be provided to the output signal pad 122, thereby preventing the second analog circuit 134 from being damaged.

In a third example, one or more of the supply clamps 151-155 are implemented using a distributed active supply clamp. For example, any of the supply clamps 151-155 can be implemented in accordance with the distributed active supply clamp of 15B.

In a fourth example, one or more of the protection circuits of the chip interface 200 are implemented using a FinFET diode and/or FinFET SCR. For example, any of the protection circuits of FIG. 4 can be implemented in accordance with the FinFET diodes and/or FinFET SCRs of FIGS. 7A-11D.

In a fifth example, the first digital circuit 131 is implemented in accordance with a receiver circuit with embedded overstress protection. For example, the first digital circuit 131 can be implemented in accordance with the receiver circuit of FIG. 12C.

In a sixth example, an interface between the second digital circuit 132 and the first analog circuit 133 can be implemented in accordance with cross-domain protection against field-induced charged-device model (FICDM) overstress. For example, the interface between the second digital circuit 132 and the first analog circuit 133 can be implemented in accordance with the cross-domain communication circuitry of FIGS. 16A and/or 16B.

In a seventh example, the second analog circuit 134 is implemented in accordance with a transmitter circuit with segmented ballast resistance. For example, the second analog circuit 134 can be implemented in accordance with the transmitter circuit of FIG. 13B.

In an eighth example, the cross-domain power low overstress protection circuit 162 is implemented with a configurable number of anti-parallel diode segments for coupling between the power low pads 111-113 of the digital circuit domains and the power low pads 114-115 of the analog circuit domains. Accordingly, an amount of cross-domain protection can be customized. Examples of configuration structures for such customization including, but are not limited to, metallization, fuses, and/or switches.

In a ninth example, the cross-domain secondary overstress protection circuit 163 is implemented with a configurable number of segments. For example, the cross-domain secondary overstress protection circuit 163 can be implemented in accordance with the cross-domain secondary overstress protection circuit of FIG. 17. For instance, the cross-domain secondary overstress protection circuit 163 can be implemented using segmented programmable MOS FinFETs configured with the gate coupled to the off-state and/or using segmented FinFET diodes.

In a tenth example, the chip interface 200 is implemented using any combination of the nine examples above. Although various example implementations of the chip interface 200 have been described above, the chip interface 200 can be implemented in accordance with any of the embodiment herein.

Although the chip interface 200 of FIG. 4 illustrates one example of a chip interface suitable for incorporating overstress protection circuitry in accordance with the present disclosure, the teachings herein are applicable to chip interfaces implemented in a wide variety of ways. Accordingly, the overstress protection circuitry herein can be used in other electrical interfaces for semiconductor chips, such as chip interfaces including more or fewer pads, more or fewer power domains, and/or other implementations of interface circuitry.

Figure 5:
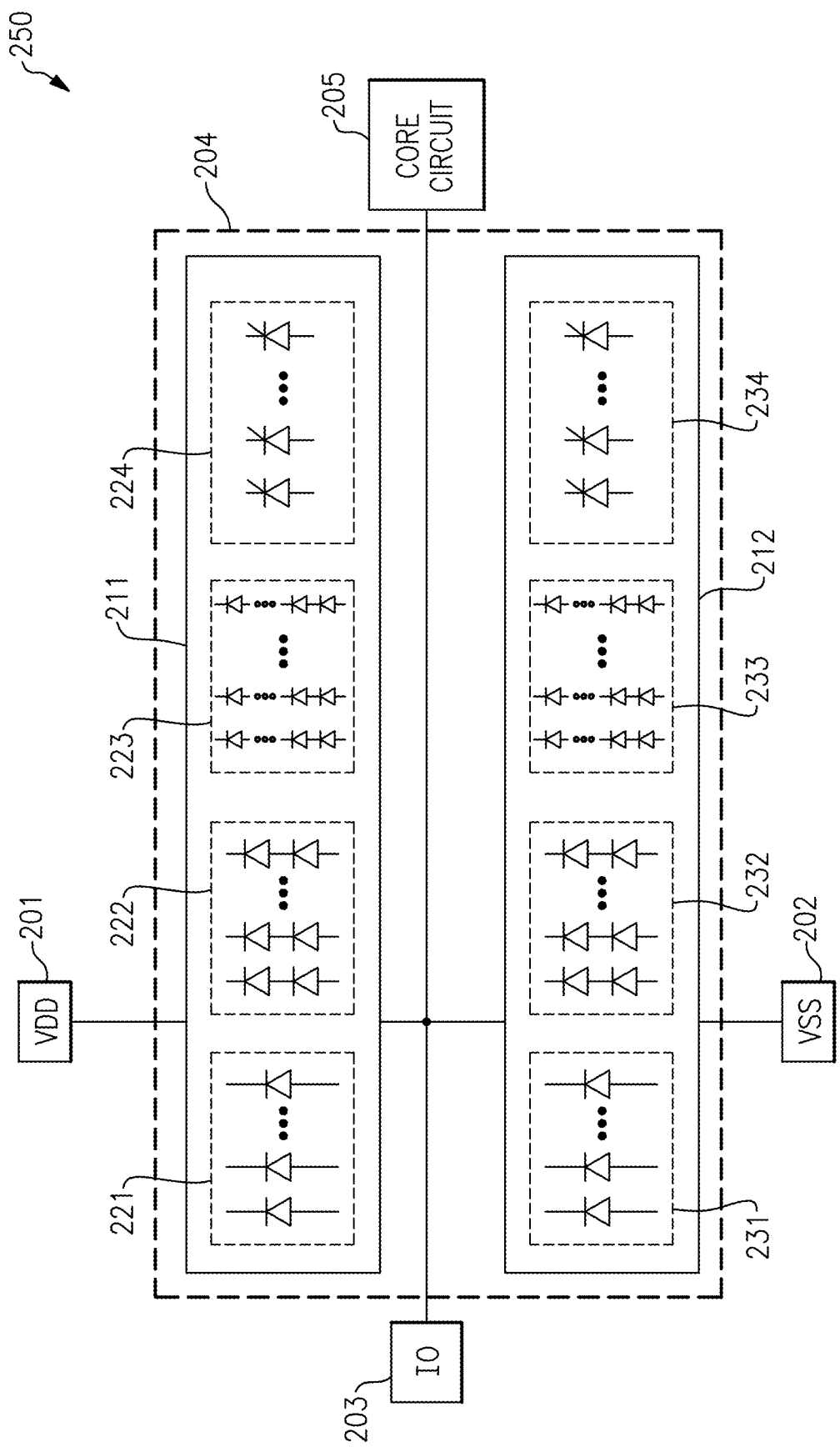
FIG. 5 is a schematic diagram of a chip interface having a segmented configurable overstress protection array according to one embodiment.

FIG. 5 is a schematic diagram of a chip interface 250 having a segmented configurable overstress protection array according to one embodiment. As shown in FIG. 5, the chip interface 250 includes a power high pad 201, a power low pad 202, a signal pad 203, a configurable overstress protection array 204, and a core circuit 205.

The configurable overstress protection array 204 can be used to provide customizable protection against electrical overstress to a pad of a chip interface. For example, one or more instantiations of the configurable overstress protection array 204 of FIG. 5 can be included in the chip interface 200 of FIG. 4 to protect one or more of the interface's core circuits 131-134. For instance, the configurable overstress protection array 204 can be used to implement the primary forward overstress protection circuit 141 and the primary reverse overstress protection circuit 143 of FIG. 3 and/or the primary forward overstress protection circuit 142 and the primary reverse overstress protection circuit 144 of FIG. 4.

Since the configurable overstress protection array 204 includes a diverse selection of protection devices, the configurable overstress protection array 204 is also referred to herein as a heterogeneous overstress protection array.

Although the chip interface of FIG. 4 illustrates one example of a chip interface in which the configurable overstress protection array 204 can be deployed, the configurable overstress protection array 204 can be implemented in a wide range of chip interfaces.

In the illustrated embodiment, the configurable overstress protection array 204 includes a customizable forward protection circuit 211 including a bank of forward protection diode segments 221, a bank of forward protection dual or double diode segments 222, a bank of forward protection triple diode segments 223, and a bank of forward protection SCR segments 224. The configurable overstress protection array 204 further includes a customizable reverse protection circuit 212 including a bank of reverse protection diode segments 231, a bank of reverse protection dual diode segments 232, a bank of reverse protection triple diode segments 233, and a bank of reverse protection SCR segments 234. An SCR is also referred to herein as a thyristor.

Any combination of the device segments shown in the customizable forward protection circuit 211 of FIG. 5 can be electrically connected between the power high pad 201 and the signal pad 203, thereby providing a desired amount of and/or type of forward protection for the signal pad 203. For example, one or more device segments from the bank of forward protection diode segments 221, the bank of forward protection dual diode segments 222, the bank of forward protection triple diode segments 223, and/or the bank of forward protection SCR segments 224 can be individually selected for inclusion between the power high pad 201 and the signal pad 203.

Accordingly, any desired combination of device segments can be used to provide protection against forward electrical overstress (for instance, a positive polarity electrical overstress event) that causes a voltage of the signal pad 203 to increase relative to the power high pad 201.

The customizable forward protection circuit 211 can be configured with a particular selection of device segments using any suitable configuration structures for selectively connecting the desired combination of device segments between the power high pad 201 and the signal pad 203. In one example, metallization during backend processing of a semiconductor chip is used to connect the desired combination of device segments between the pads.

Although the illustrated embodiment of forward protection includes banks of diode segments and SCR segments, other types of device segments can be used for providing overstress protection. Furthermore, although an example with single diode segments, two series diode segments, and three series diode segments is shown, other numbers of diodes can be included in series. Additionally or alternatively, SCR segments can include two or more SCRs in series. Moreover, in certain implementations, one or more SCRs, one or more diodes, and/or one or more other protection devices are connected in series.

Each bank of the customizable forward protection circuit 211 can include any number of device segments, for instance, a number of device segments selected in the range of 1 to 100, or more particularly, 4 to 10. Furthermore, one or more of the banks can be omitted and/or other types of banks can be used.

With continuing reference to FIG. 5, any combination of the device segments shown in the customizable reverse protection circuit 212 can be electrically connected between the signal pad 203 and the power low pad 202, thereby providing a desired amount of and/or type of reverse protection for the signal pad 203. For example, one or more device segments from the bank of reverse protection diode segments 231, the bank of reverse protection dual diode segments 232, the bank of reverse protection triple diode segments 233, and/or the bank of reverse protection SCR segments 234 can be individually selected for inclusion between the signal pad 203 and the power low pad 202.

Accordingly, any desired combination of device segments can be used to provide protection against reverse electrical overstress (for instance, a negative polarity electrical overstress event) that causes a voltage of the signal pad 203 to decrease relative to the power low pad 202.

The customizable reverse protection circuit 212 can be configured with a particular selection of device segments using any suitable configuration structures for selectively connecting the desired combination of device segments between the signal pad 203 and the power low pad 202. In one example, metallization during backend processing of a semiconductor chip is used to connect the desired combination of device segments between the pads.

Although the illustrated embodiment of reverse protection includes banks of diode segments and SCR segments, other types of device segments can be used for providing overstress protection. Furthermore, although an example with single diode segments, two series diode segments, and three series diode segments is shown, other numbers of diodes can be included in series. Additionally or alternatively, SCR segments can include two or more SCRs in series. Moreover, in certain implementations, one or more SCRs, one or more diodes, and/or one or more other protection devices are connected in series.

Each bank of the customizable reverse protection circuit 212 can include any number of device segments, for instance, a number of device segments selected in the range of 1 to 100, or more particularly, 4 to 10. Furthermore, one or more of the banks can be omitted and/or other types of banks can be used.

The diode segments and the SCR segments of the customizable forward protection circuit 211 and the customizable reverse protection circuit 212 can be implemented in a wide variety of ways. For example, the diode segments and/or the SCR segments can be implemented using FinFET structures, including, but not limited to, any of the FinFET diodes and/or FinFET SCRs described with respect to the embodiments of FIGS. 7A-11D.

In certain implementations, a diode segment includes one or more diodes implemented as a gated diode. For example, a gated diode can include a p-type region (for instance, a P+ region) formed in a semiconductor region (for instance, a p-type or n-type semiconductor well) and an n-type region (for instance, an N+ region) formed in the semiconductor region. Additionally, a transistor gate (for instance, a metal gate of a field-effect transistor) is included between the p-type region and the n-type region over a surface of the semiconductor region. A diode with a gate is referred to herein as a gated diode. In certain implementations, the gated diodes is a FinFET gated diode, and the p-type region corresponds to a P+ fin and the n-type region corresponds to an N+ fin.

Implementing a diode segment using one or more gated diodes provides a number of advantages, such as increased control over low capacitance characteristics in the presence of process, temperature, and/or voltage (PVT) variation.

The core circuit 205 can be any suitable type of circuit, including, but not limited to, a receiver and/or transmitter for a digital or analog interface. Additionally, the signal pad 203 can be any type of signal pad, for instance, an input signal pad, an output signal pad, or a bidirectional signal pad.

Thus, the configurable overstress protection array 204 provides configurability of various protection characteristics to aid in achieving a suitable level of protection for high speed signaling pins (for instance, the signal pad 203) that are sensitive to loading effects and/or operating characteristics of electrical overstress protection circuitry used to protect the pad.

For example, performance of the core circuit 205 can be impacted by loading effects (including, but not limited to, parasitic capacitance and/or leakage current) of the selected segments of the configurable overstress protection array 204. Thus, the configurable overstress protection array 204 provides flexibility after front-end chip processing (after semiconductor devices such as transistors and diodes have been fabricated) to select a proper amount of protection, rather than suffer from degraded performance arising from overdesign of electrical overstress protection circuitry for a worst case scenario.

Figure 6A:
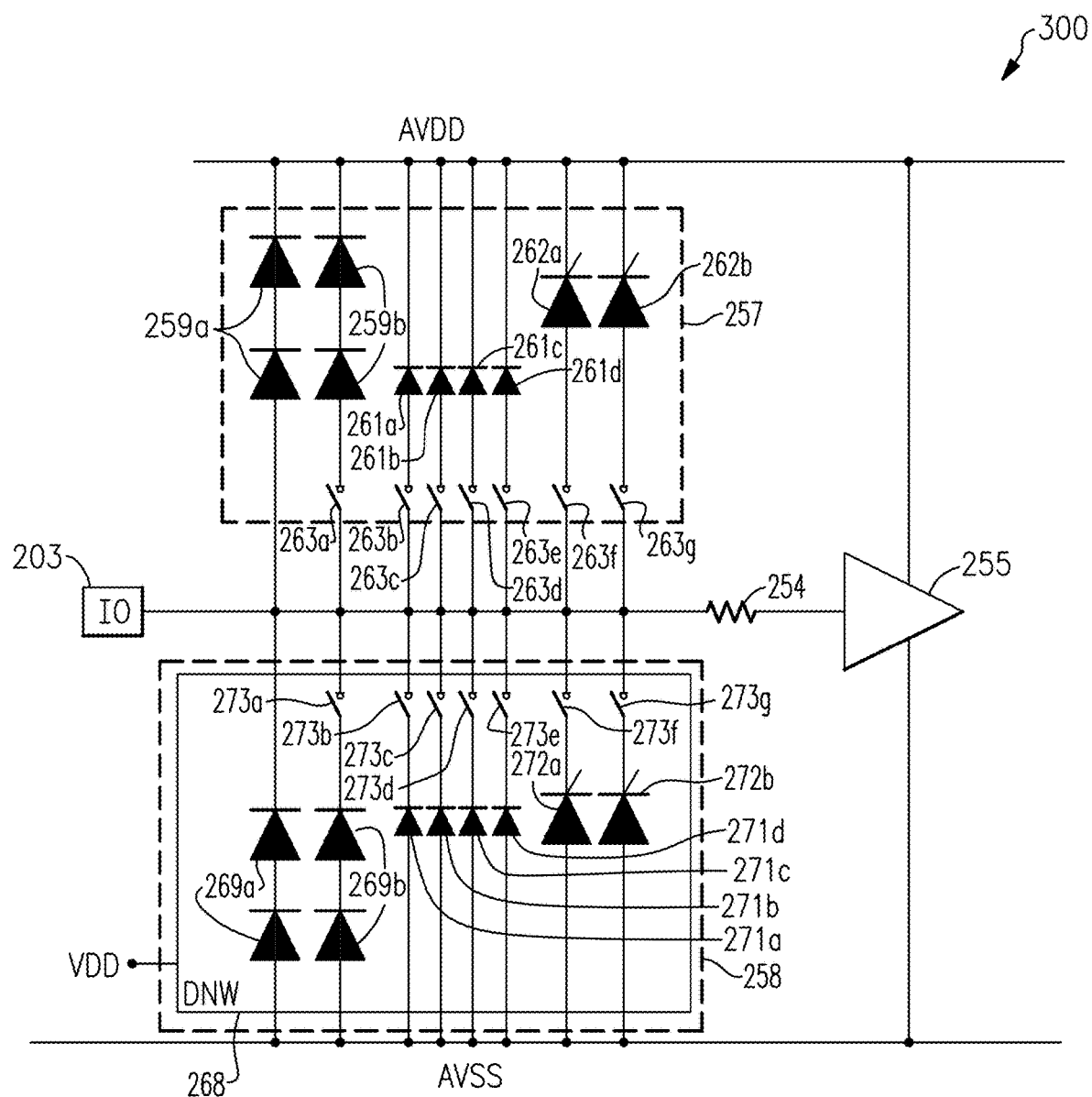
FIG. 6A is a schematic diagram of a chip interface having a segmented configurable overstress protection array according to another embodiment.

FIG. 6A is a schematic diagram of a chip interface 300 having a segmented configurable overstress protection array according to another embodiment. The chip interface 300 includes a power high rail (AVDD), a power low rail (AVSS), a signal pad 203, a resistor 254, a receiver 255, and a configurable overstress protection array including a customizable forward protection circuit 257 and a customizable reverse protection circuit 258. The power high rail is connected to one or more power high pads, while the power low rail is connected to one or more power low or ground pads.

The configurable overstress protection array of FIG. 6A can be included in a wide range of chip interfaces, including, but not limited to, the chip interface 200 of FIG. 4. Although the configurable overstress protection array of FIG. 6A illustrates one embodiment of a configurable overstress protection array, the teachings herein are applicable to configurable overstress protection arrays implemented in a wide variety of ways. For example, a configurable overstress protection array can include more or fewer device segments and/or device segments of other types.

In the illustrated embodiment, the customizable forward protection circuit 257 includes a first FinFET dual diode segment 259a, a second FinFET dual diode segment 259b, a first FinFET diode segment 261a, a second FinFET diode segment 261b, a third FinFET diode segment 261c, a fourth FinFET diode segment 261d, a first FinFET SCR segment 262a, a second FinFET SCR segment 262b, and first to seventh configuration structures 263a-263g, respectively.

As shown in FIG. 6A, the customizable reverse protection circuit 258 includes a first FinFET dual diode segment 269a, a second FinFET dual diode segment 269b, a first FinFET diode segment 271a, a second FinFET diode segment 271b, a third FinFET diode segment 271c, a fourth FinFET diode segment 271d, a first FinFET SCR segment 272a, a second FinFET SCR segment 272b, and first to seventh configuration structures 273a-273g, respectively. The customizable reverse protection circuit 258 is isolated by deep n-well (DNW) 268, thereby enhancing isolation between the customizable reverse protection circuit 258 and the customizable forward protection circuit 257 and/or mitigating latch-up risks.

Although one embodiment of a customizable forward protection circuit and of a customizable reverse protection circuit is shown, customizable forward protection circuits and customizable reverse protection circuits can be implemented in a wide variety of ways.

The configuration structures 263a-263g/273a-273g can implemented in a wide variety of ways, including, but not limited to, using metallization, fuses, and/or switches. In the illustrated embodiment, a first portion of the device segments (the first FinFET dual diode segment 259a and the first FinFET dual diode segment 269a, in this example) are connected between the signal pad 302 and appropriate power rails to provide a lowest or minimum amount of electrical overstress protection. Additionally, one or more segments from a second portion of the device segments are individually selectable by the configuration structures 263a-263g/273a-273g to provide customizable control over various overstress protection characteristics, such as forward trigger voltage, forward holding voltage, reverse trigger voltage, reverse holding voltage, leakage current, capacitive loading, type of protection element, current handling capability, and/or other characteristics.

Each device segment of the customizable forward protection circuit 257 and the customizable reverse protection circuit 258 can include any number of device segments, for instance, a number of device segments selected in the range of 1 to 100. Furthermore, one or more of the device segments can be omitted and/or other types of device segments can be used.

The diode segments and the SCR segments of the customizable forward protection circuit 257 and the customizable reverse protection circuit 258 can be implemented in a wide variety of ways. For example, the diode segments and/or the SCR segments can be implemented using any of the FinFET diodes and/or FinFET SCRs described with respect to the embodiments of FIGS. 7A-11D.

With general reference to FIGS. 6B-6K, various examples of simulation results are depicted for an implementation of a configurable overstress protection array including six segments of p-type diodes between a power high rail and a signal pad, and six segments of n-type FinFET diodes between the signal pad and a power low rail.

Figure 6B:
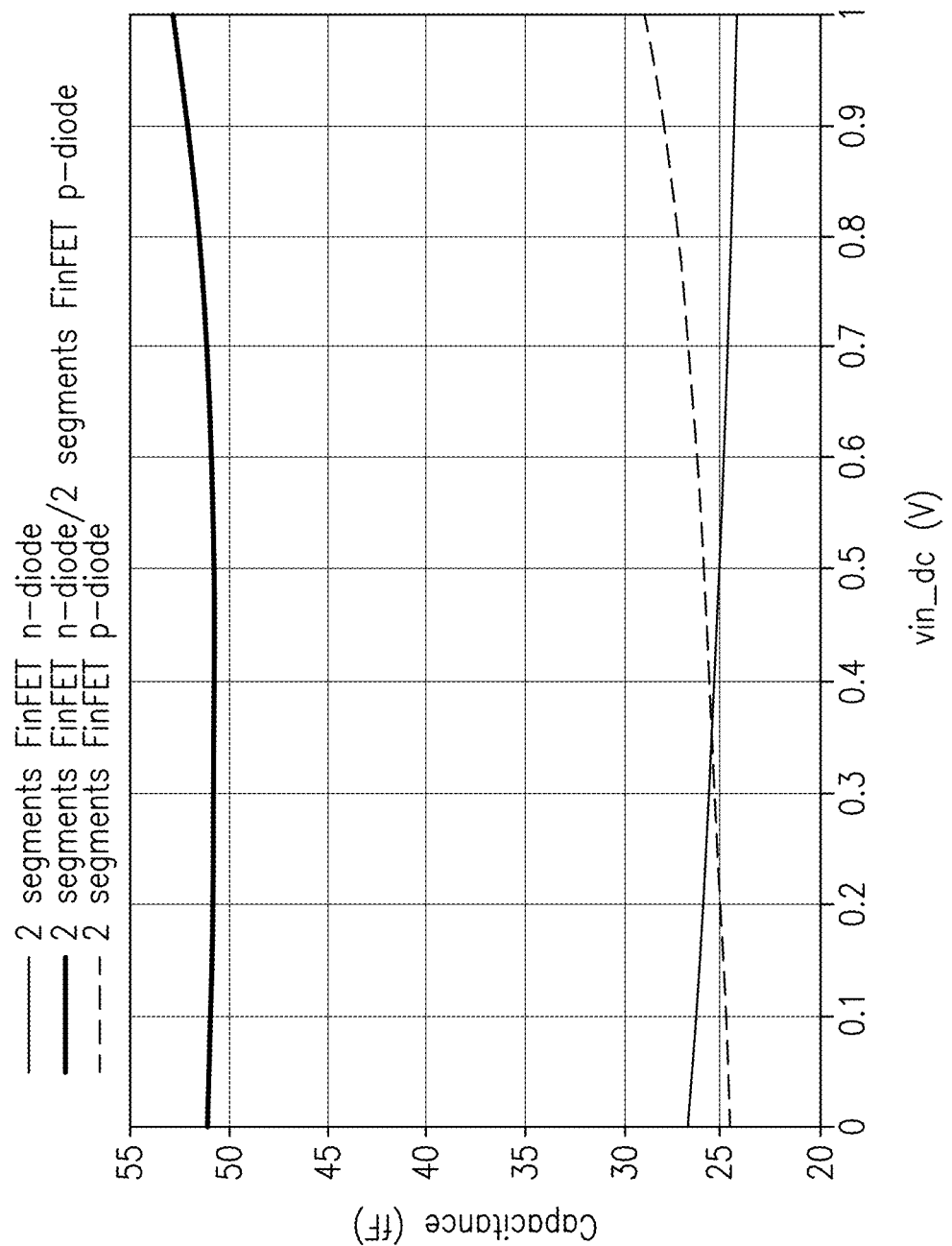
FIG. 6B is one example of a graph of capacitance versus voltage for various examples of FinFET diode segment combinations.

FIG. 6B is one example of a graph of capacitance versus voltage for various examples of FinFET diode segment combinations.

The graph includes plots of capacitance versus voltage when two segments of n-type FinFET diode are selected, when two segments of p-type FinFET diode are selected, and when both two segments of n-type FinFET diode and two segments of p-type FinFET diode are selected. As shown in FIG. 6B, the configurable overstress protection array illustrates a relatively flat capacitance versus voltage characteristic. The capacitance is provided for an example in which metallization capacitance for eleven metal layers is included for high level metal programmability. In this example, the capacitance of one FinFET diode segment (including metallization) is around 13 fF.

Figure 6C:
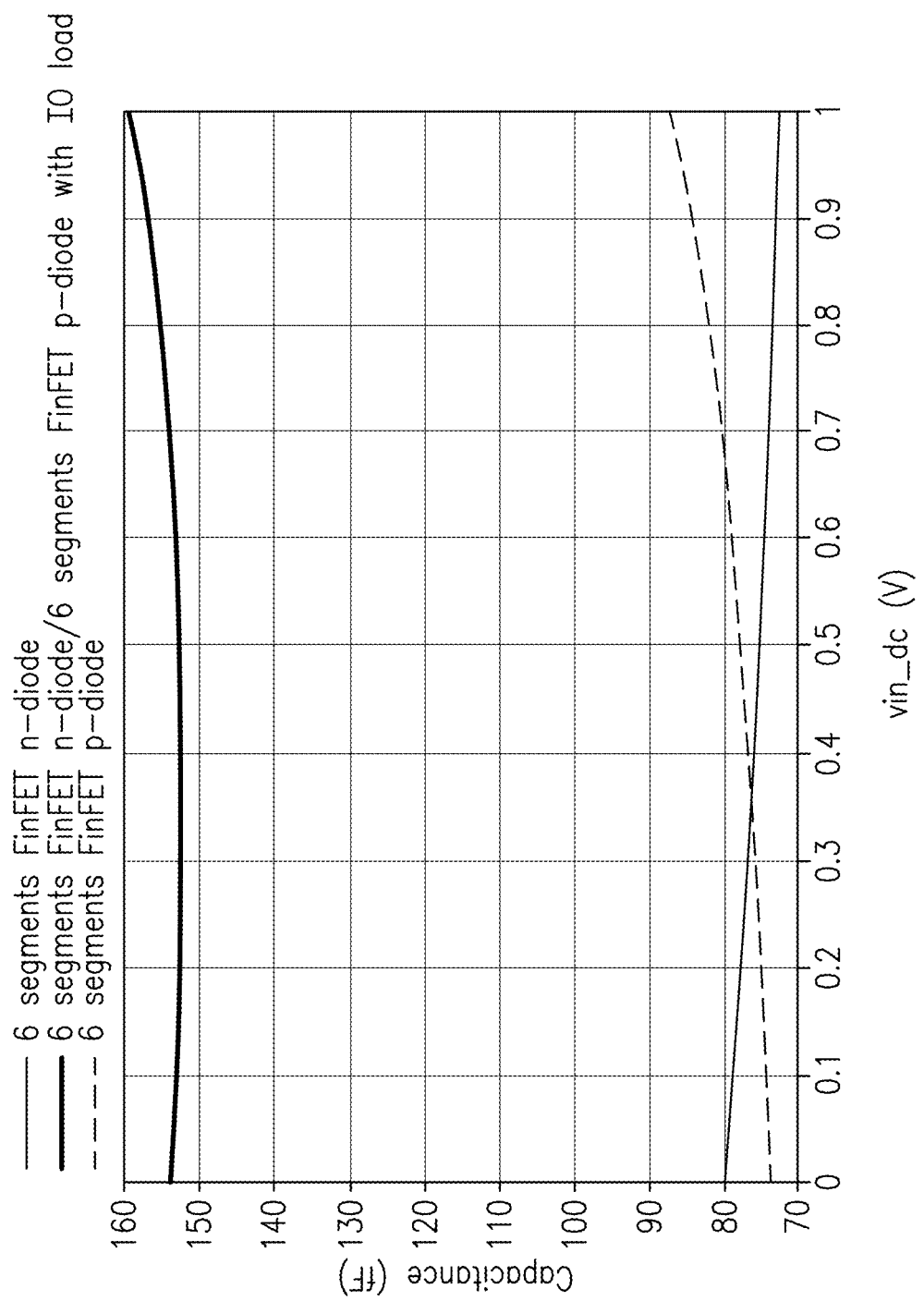
FIG. 6C is another example of a graph of capacitance versus voltage for various examples of FinFET diode segment combinations.

FIG. 6C is another example of a graph of capacitance versus voltage for various examples of FinFET diode segment combinations.

The graph includes plots of capacitance versus voltage when six segments of n-type FinFET diode are selected, when six segments of p-type FinFET diode are selected, and when both six segments of n-type FinFET diode and six segments of p-type FinFET diode are selected with IO loading included. The capacitance is provided for an example in which metallization capacitance for eleven metal layers is included. As shown in FIG. 6C, the configurable overstress protection array illustrates a relatively flat capacitance versus voltage characteristic.

Figure 6D:
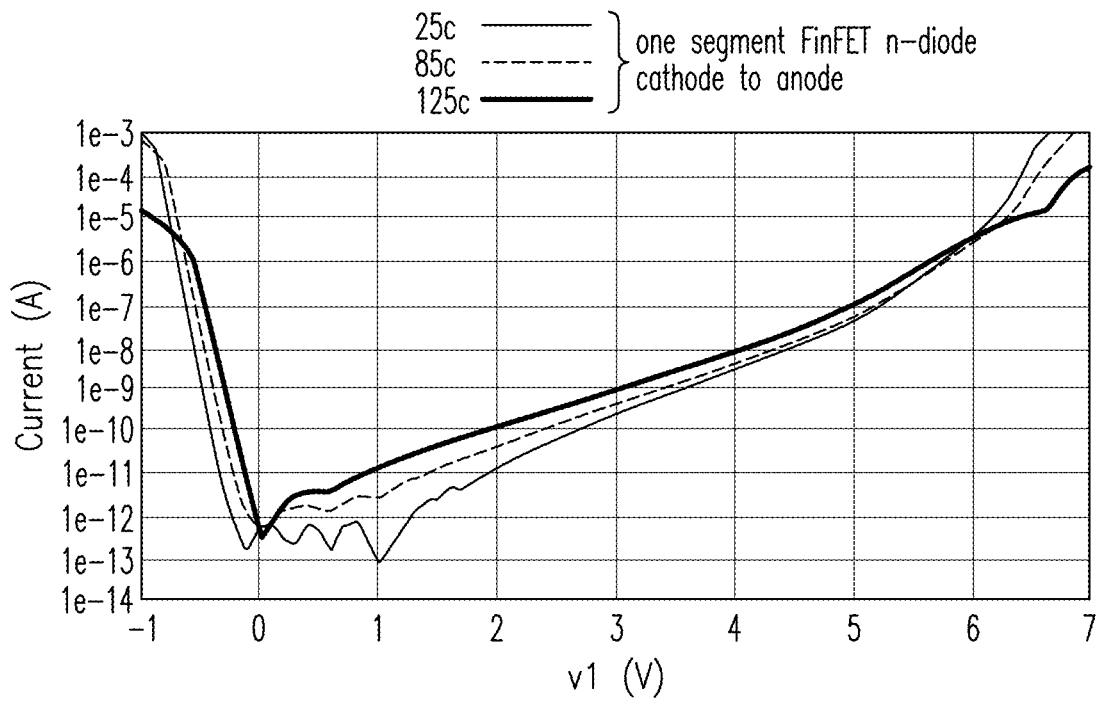
FIG. 6D is one example of a graph of leakage current versus voltage for an n-type FinFET diode segment operating at various temperatures.

FIG. 6D is one example of a graph of leakage current versus voltage for an n-type FinFET diode segment operating at various temperatures.

The graph corresponds to a simulation in which one n-type FinFET diode segment is selected. Plots are shown for operating temperatures of 25 degrees Celsius (° C.), 85° C., and 125° C.

Figure 6E:
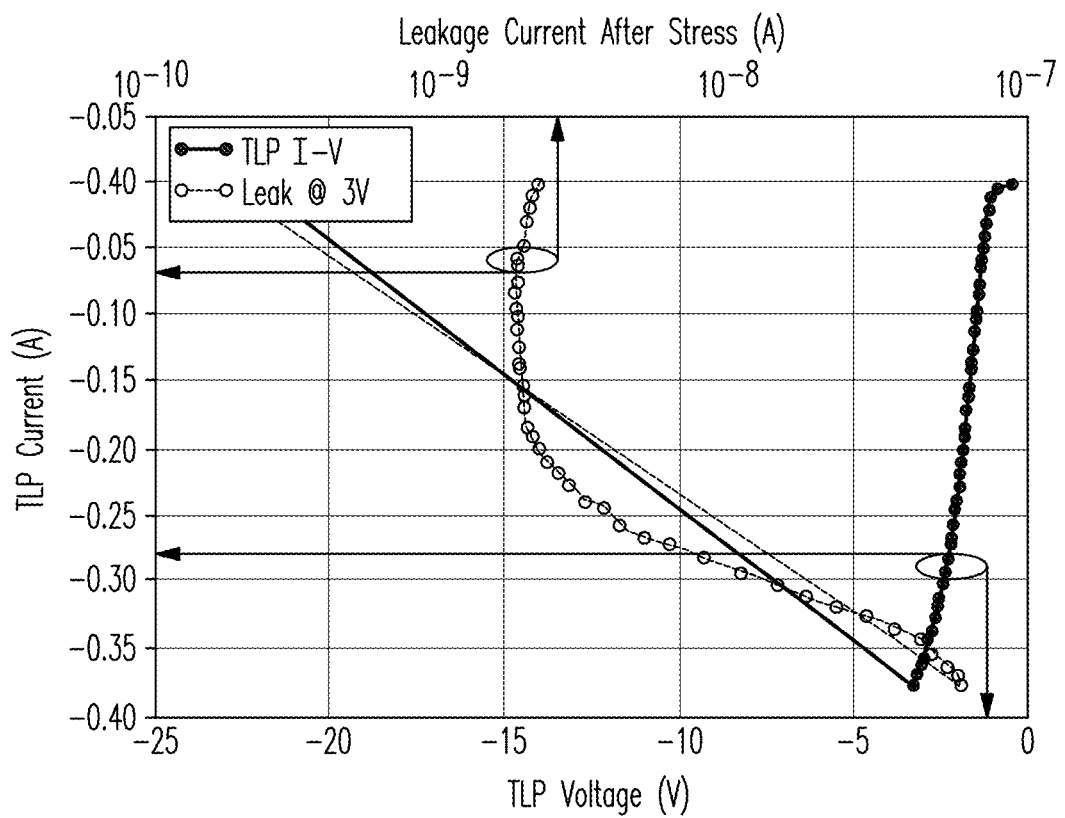
FIG. 6E is one example of a graph of transmission line pulsing (TLP) current versus TLP voltage and of leakage current versus TLP (100 ns pulse width/600 ps rise time) current for an n-type FinFET diode segment.

FIG. 6E is one example of a graph of transmission line pulsing (TLP) current versus TLP voltage and of leakage current versus TLP (100 ns pulse width/600 ps rise time) current for an n-type FinFET diode segment. The leakage current corresponds to leakage after test taken at 3V.

The graph corresponds to a simulation in which one n-type FinFET diode segment is selected.

Figure 6F:
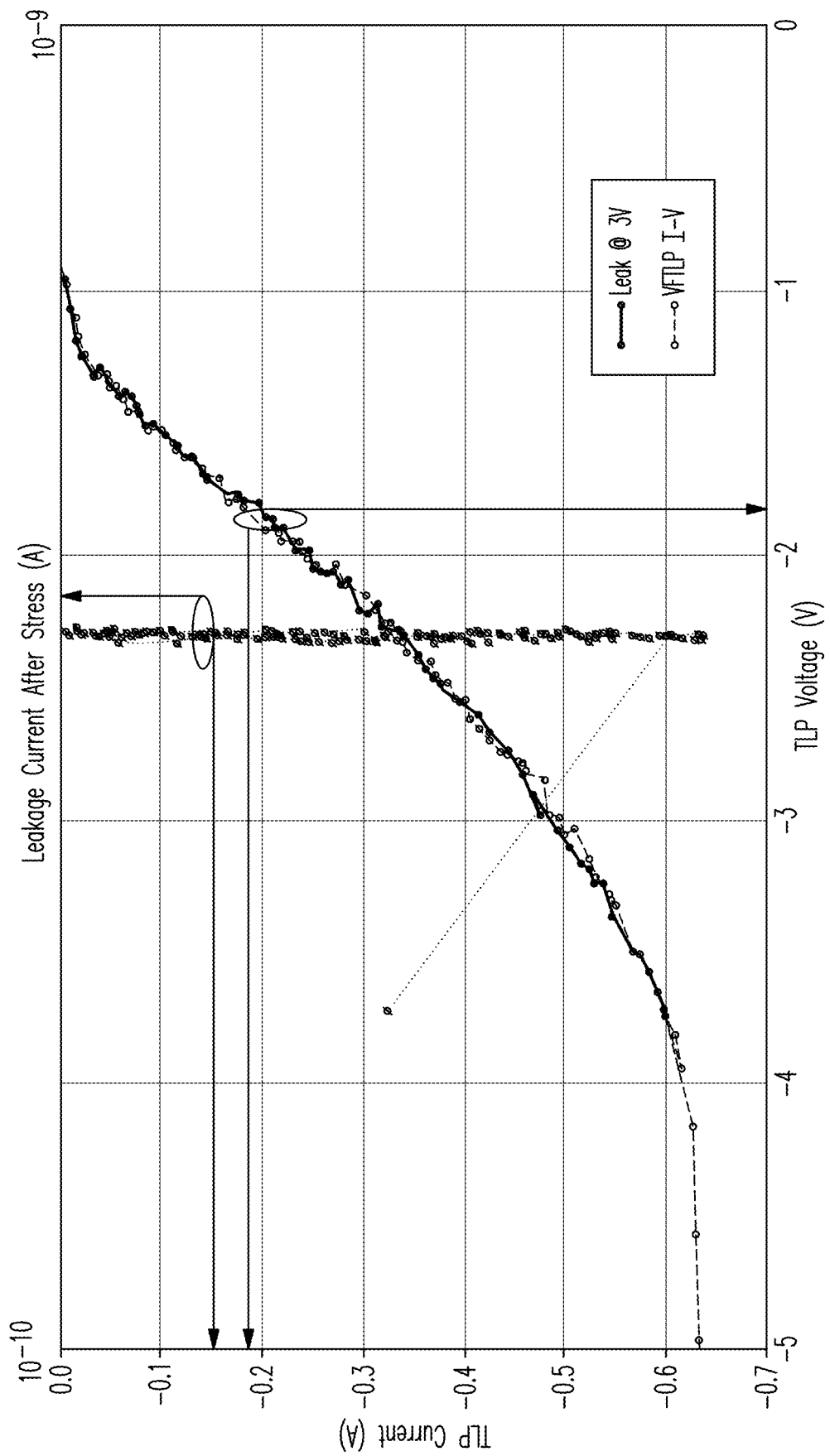
FIG. 6F is another example of a graph of very fast TLP (VFTLP) (5 ns pulse width/300 ps rise time) current versus VFTLP voltage and of leakage current versus VFTLP current for a FinFET diode segment.

FIG. 6F is another example of a graph of very fast TLP (VFTLP) (5 ns pulse width/300 ps rise time) current versus VFTLP voltage and of leakage current versus VFTLP current for a FinFET diode segment.

The graph corresponds to a simulation in which one n-type FinFET diode segment is selected, and plots are provided for two different TLP simulations. As shown in FIG. 6F, the segment operates with high current handling capability for relatively short 5 ns stress pulse when compared with the longer stress pulse of FIG. 6E.

Figure 6G:
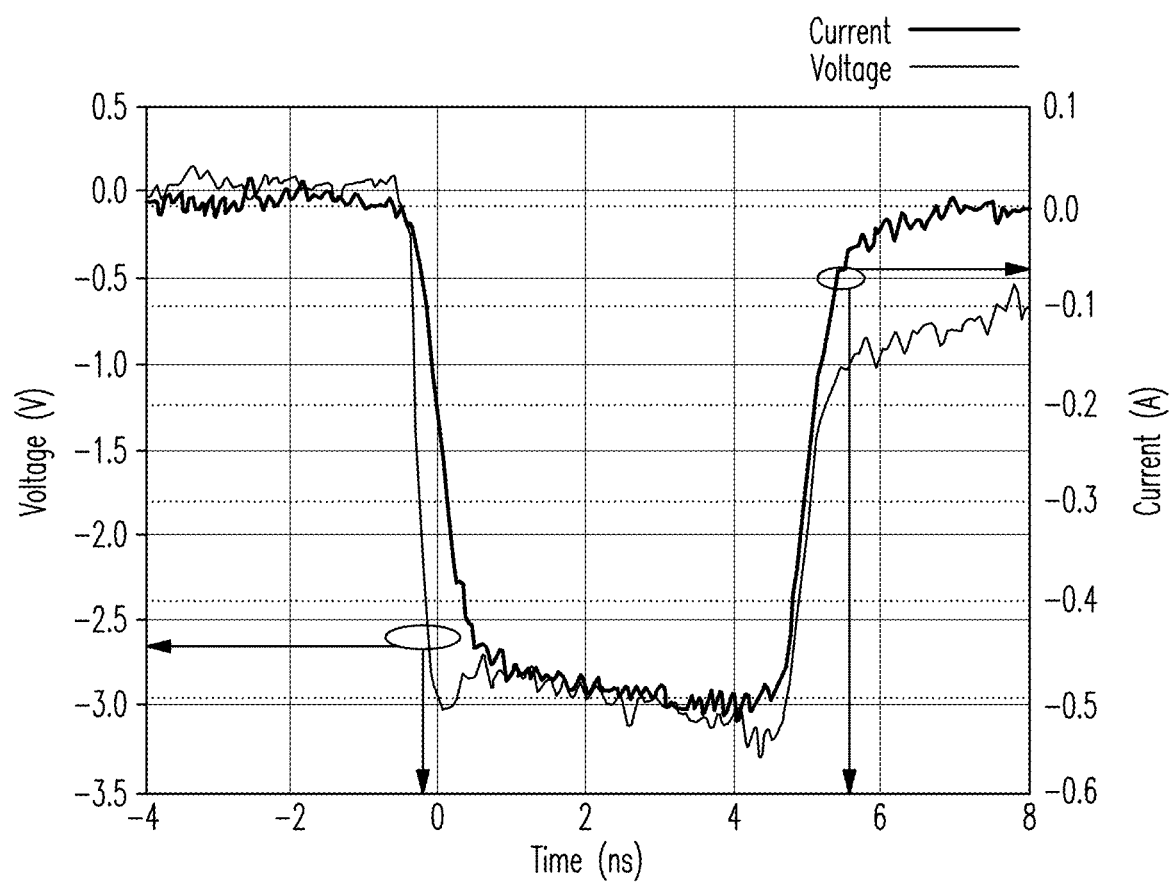
FIG. 6G is one example of a graph of VFTLP voltage and current versus time waveforms for an n-type FinFET diode segment.

FIG. 6G is one example of a graph of VFTLP voltage and current versus time waveforms for an n-type FinFET diode segment.

The graph corresponds to a simulation in which one n-type FinFET diode segment is selected. The simulation is for a FICDM current of about 200 mA.

Figure 6H:
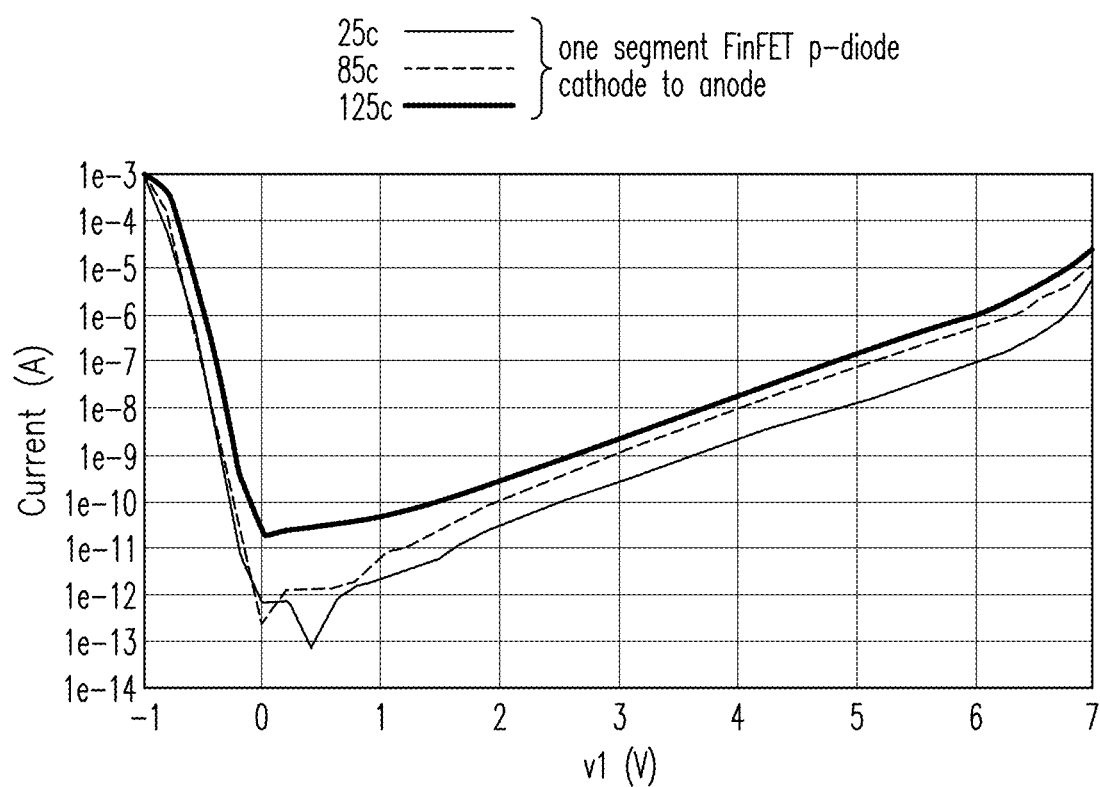
FIG. 6H is another example of a graph of leakage current versus voltage for a p-type FinFET diode segment operating at various temperatures.

FIG. 6H is another example of a graph of leakage current versus voltage for a p-type FinFET diode segment operating at various temperatures.

The graph corresponds to a simulation in which one p-type FinFET diode segment is selected. Plots are shown for operating temperatures of 25° C., 85° C., and 125° C.

Figure 6I:
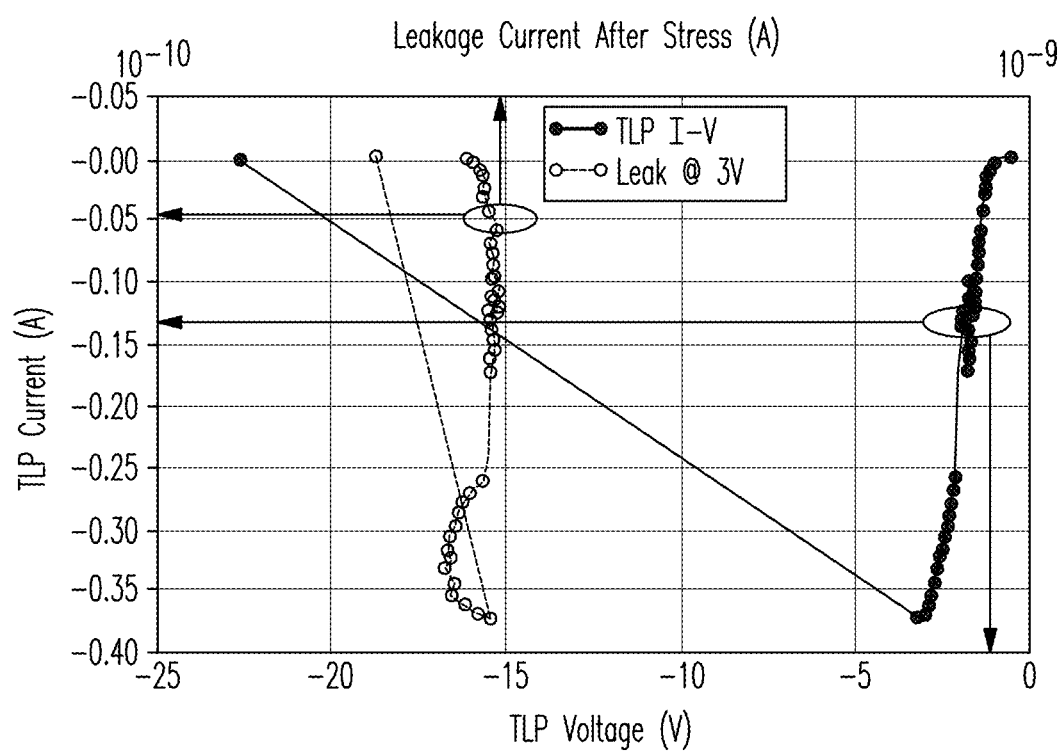
FIG. 6I is another example of a graph of TLP current versus TLP (100 ns pulse width/600 ps rise time) voltage and of leakage current versus TLP current for a p-type FinFET diode segment.

FIG. 6I is another example of a graph of TLP current versus TLP (100 ns pulse width/600 ps rise time) voltage and of leakage current versus TLP current for a p-type FinFET diode segment.

The graph corresponds to a simulation in which one p-type FinFET diode segment is selected.

Figure 6J:
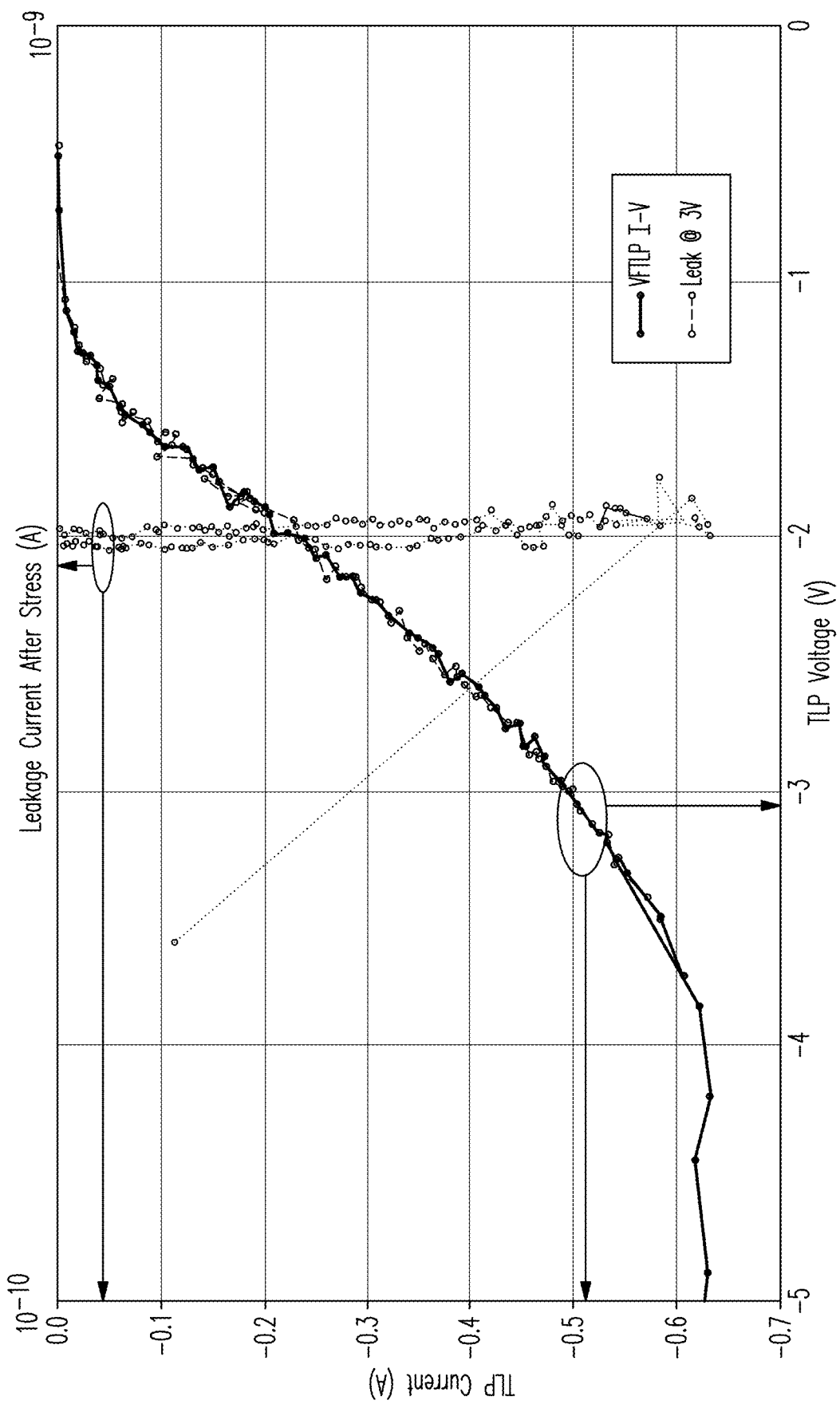
FIG. 6J is another example of a graph of VFTLP (5 ns pulse width/300 ps rise time) current versus VFTLP voltage and of leakage current versus VFTLP current for a p-type FinFET diode segment.

FIG. 6J is another example of a graph of VFTLP (5 ns pulse width/300 ps rise time) current versus VFTLP voltage and of leakage current versus VFTLP current for a p-type FinFET diode segment.

The graph corresponds to a simulation in which one p-type FinFET diode segment is selected, and plots are provided for two different TLP simulations. As shown in FIG. 6J, the segment operates with high current handling capability, and the pulse emulates FICDM stress.

Figure 6K:
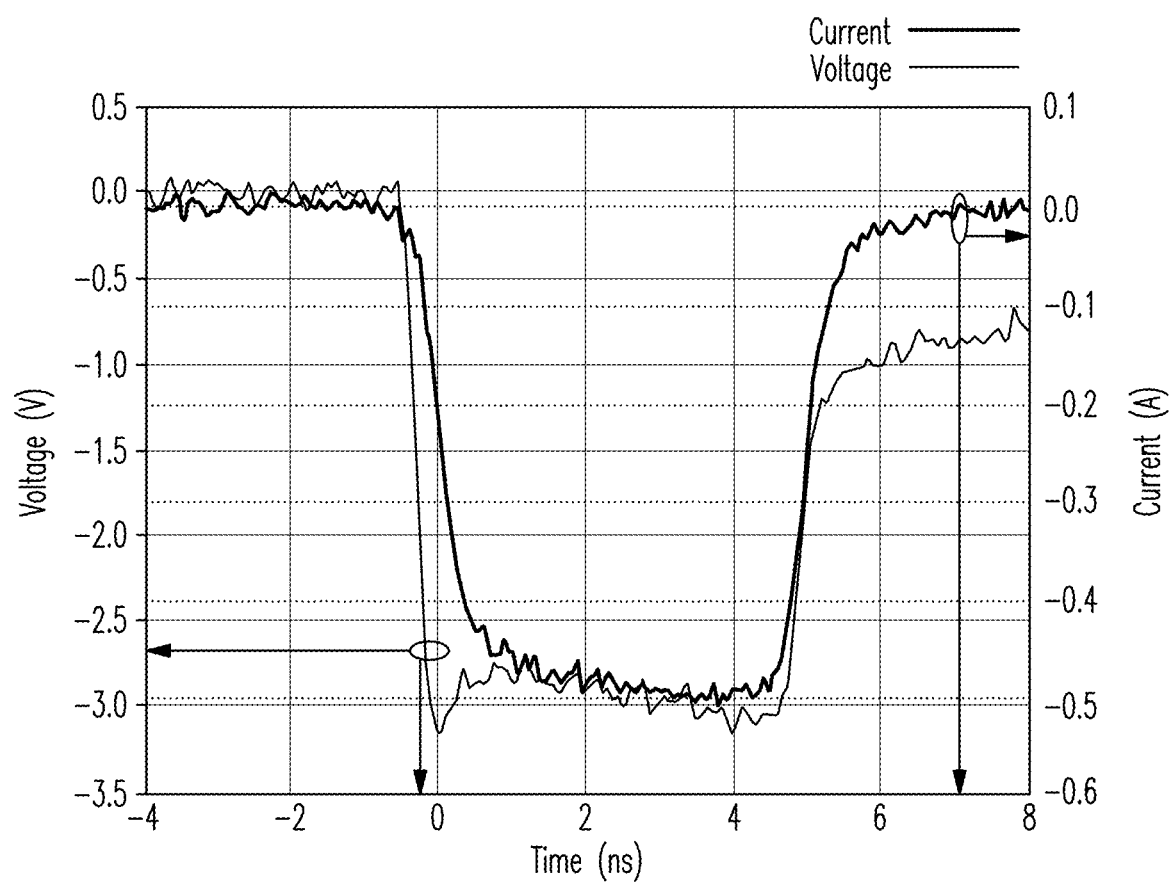
FIG. 6K is another example of a graph of voltage and current versus time waveforms for a p-type FinFET diode segment.

FIG. 6K is another example of a graph of voltage and current versus time waveforms for a p-type FinFET diode segment.

The graph corresponds to a simulation in which one p-type FinFET diode segment is selected. The simulation is for a FICDM current of about 200 mA.

Figure 6L:
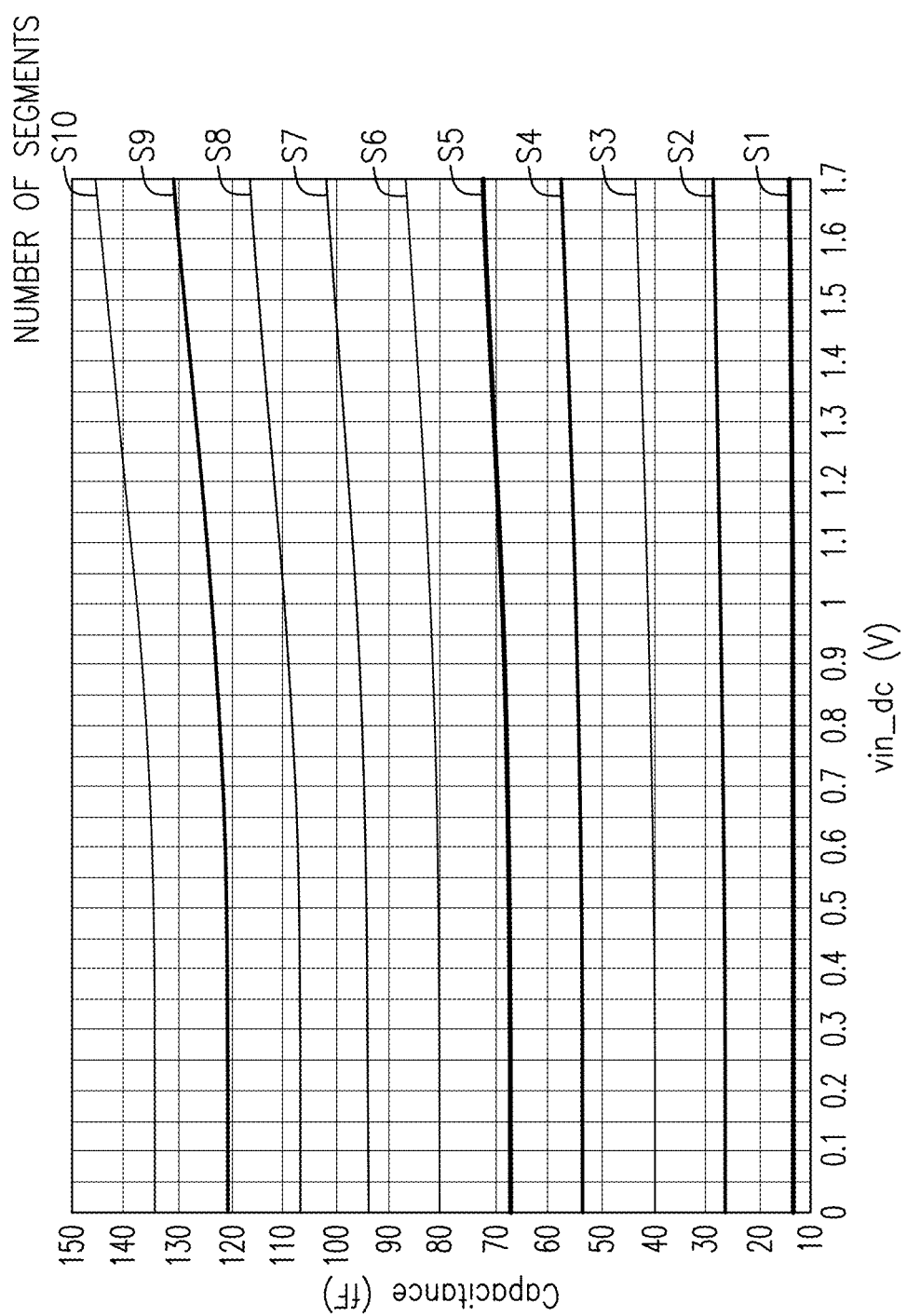
FIG. 6L is one example of a graph of capacitance versus voltage for various examples of FinFET dual diode up and dual diode down interface input/output connection configurations.
Figure 6M:
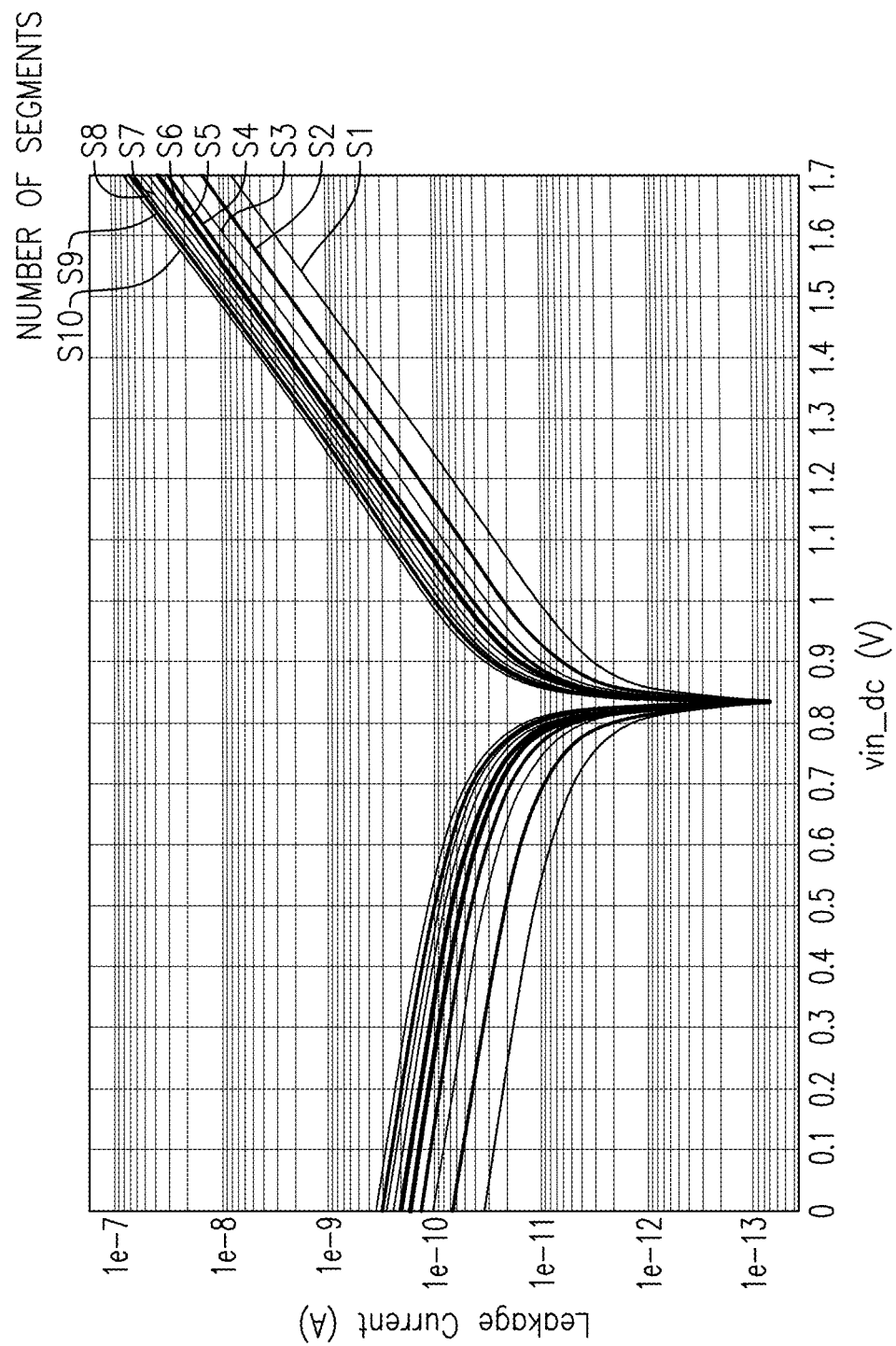
FIG. 6M is one example of a graph of leakage current versus voltage for various examples of FinFET dual diode up and dual diode down interface input/output connection configurations from FIG. 6L, at power high of 1 V and power low of zero volts.

With general reference to FIGS. 6L and 6M, various examples of simulation results are depicted for an implementation of a configurable overstress protection array including ten segments of p-type FinFET dual diodes between a power high rail and a signal pad, and ten segments of n-type FinFET dual diodes between the signal pad and a power low rail.

FIG. 6L is one example of a graph of capacitance versus voltage for various examples of FinFET dual diode up, for instance dual FinFET p-type diode up, and dual diode down, for instance dual FinFET n-diode down, interface input/output connection configurations. In this reference interface, the same FinFET diodes segments which characteristics are presented in FIG. 6A to 6K are considered.

With reference to FIG. 6L, an example of scaling in capacitance for a dual diode up and dual diode down segmentation programmable from 1 to 10 segments is provided. As shown in FIG. 6L, capacitance increases from about 15 fF to about 135 fF when selecting a configuration with one programmable segment relative to selecting a configuration with ten programmable segments. Additionally, by incrementally adding each extra segment, stress current handling capability increases by about 250 mA for a FICDM stress condition.

FIG. 6M is one example of a graph of leakage current versus voltage for various examples of FinFET dual diode up and dual diode down interface input/output connection configurations from FIG. 6L, at power high of 1 V and power low of zero volts.

With reference to FIG. 6M, an example of scaling in capacitance for a dual diode up and dual diode down segmentation programmable from 1 to 10 segments is provided. As shown in FIG. 6M, leakage current is scaled as a number of selected segments increases. Additionally, by incrementally adding each extra segment, stress current handling capability increases by about 250 mA for a FICDM stress condition.

As shown in FIGS. 6L and 6M, using programmable segmentation allows for fine tuning of performance versus robustness design constraints, such as a tradeoff between leakage current and parasitic capacitance versus stress current handling capability.

Although FIGS. 6B-6M illustrates various examples of simulation results for a configurable overstress protection array, other simulation results are possible, including results that depend on implementation, application, and/or processing technology.

FIGS. 7A-11D illustrate various examples of FinFET devices that can be included in electrical overstress protection circuitry for a chip interface. Although various examples of FinFET devices are shown, the teachings herein are applicable to other implementations of protection devices. Accordingly, other implementations are possible.

The devices herein can include various wells (for instance, n-type well (NW) and/or p-type well (PW) regions), various active regions (for instance, n-type active (N+) and/or p-type active (P+) regions), gates, and/or other structures. As persons of ordinary skill in the art will appreciate, P+ regions have a higher doping concentration than the PWs. Additionally, N+ regions have a higher doping concentration than NWs. Persons having ordinary skill in the art will appreciate various concentrations of dopants in the regions.

It should be appreciated that because regions within a semiconductor device are defined by doping different parts of a semiconductor material with differing impurities or differing concentrations of impurities, discrete physical boundaries between different regions may not actually exist in the completed device but instead regions may transition from one to another. Some boundaries as shown in the figures of this type and are illustrated as abrupt structures merely for the assistance of the reader. As persons having ordinary skill in the art will appreciate, p-type regions can include a p-type semiconductor material, such as boron, as a dopant. Furthermore, n-type regions can include an n-type semiconductor material, such as phosphorous, as a dopant.

FIG. 7A is a perspective view of a FinFET diode 410 with shallow trench isolation (STI) inter-active isolation according to one embodiment. FIG. 7B is a cross-section of the FinFET diode 410 of FIG. 7A taken along the lines 7B-7B.

With reference to FIGS. 7A and 7B, the FinFET diode 410 is formed in a substrate 401, and includes N+ fins 402, P+ fins 403, shallow trench isolation (STI) regions 404, gates 405, an anode electrode or terminal 407, and a cathode electrode 408. As shown in FIGS. 7A and 7B, the N+ fins 402 and the P+ fins extend from the substrate 401, and correspond to fins made using a FinFET fabrication technology or process. Additionally, the gates 405 correspond to transistor gates made using the FinFET process.

The FinFET diode 410 includes gates 405 over the substrate 401, with a portion of the gates 405 positioned between the N+ fins 402 and the P+ fins 403. Thus, the FinFET diode 410 is a gated diode. When the semiconductor region beneath the gates 405 has an n-type doping (for instance when an NW is formed in the substrate 401 beneath the device), the FinFET diode 410 is referred to as an n-type FinFET gated diode. Additionally, when the semiconductor region beneath the gates 405 has a p-type doping (for instance when a PW is formed in the substrate 401 beneath the device), the FinFET diode 410 is referred to as a p-type FinFET gated diode.

Using a gated diode provides a number of advantages, such as reduced leakage current, lower parasitic capacitance, and/or higher holding voltage. Furthermore, a gated diode can have superior low capacitance characteristics in the presence of PVT variation. In certain implementations herein, the gate of a gated diode (for instance, gates 405) is electrically floating during operation.

The FinFET diode 410 operates as a diode 409. For example, the anode electrode 407 is electrically connected to the P+ fins 403 and serves as an anode of the diode 409. Additionally, the cathode electrode 408 is electrically connected to the N+ fins 402 and serves as a cathode of the diode 409.

In the illustrated embodiment, the FinFET diode 410 operates with inter-active isolation (isolation between the P+ and N+ regions) provided by STI. Although FIGS. 7A and 7B illustrates one example of an inter-active isolation structure, other types of inter-active isolation can be used.

Although not illustrated in FIGS. 7A and 7B, the substrate 401 typically includes other devices or structures formed therein. For example, any of the circuitry of the chip interfaces herein can be fabricated on a common substrate of a semiconductor die.

FIG. 8A is a perspective view of a FinFET diode with fin gates inter-active isolation according to one embodiment. FIG. 8B is a cross-section of the FinFET diode 420 of FIG. 8A taken along the lines 8B-8B.

With reference to FIGS. 8A and 8B, the FinFET diode 420 is formed in the substrate 401, and includes N+ fins 402, P+ fins 403, STI regions 404, gates 405, anode electrodes 407, and a cathode electrode 408.

The FinFET diode 420 operates as a diode 409. For example, the anode electrodes 407 are electrically connected to the P+ fins 403 and serve as an anode of the diode 409. Additionally, the cathode electrode 408 is electrically connected to the N+ fins 402 and serves as a cathode of the diode 409.

In the illustrated embodiment, the FinFET diode 420 includes multiple sections or legs that can be selectively connected together using configuration structures, such as upper layers of metallization. Implementing the FinFET diode 420 using multiple sections aids in achieving a compact area while providing flexibility to control or configure current handling capability.

In the illustrated embodiment, the FinFET diode 420 operates with inter-active isolation (isolation between the P+ and N+ regions) provided by gates. Although FIGS. 8A and 8B illustrates one example of an inter-active isolation structure, other types of inter-active isolation can be used.

Figure 9C:
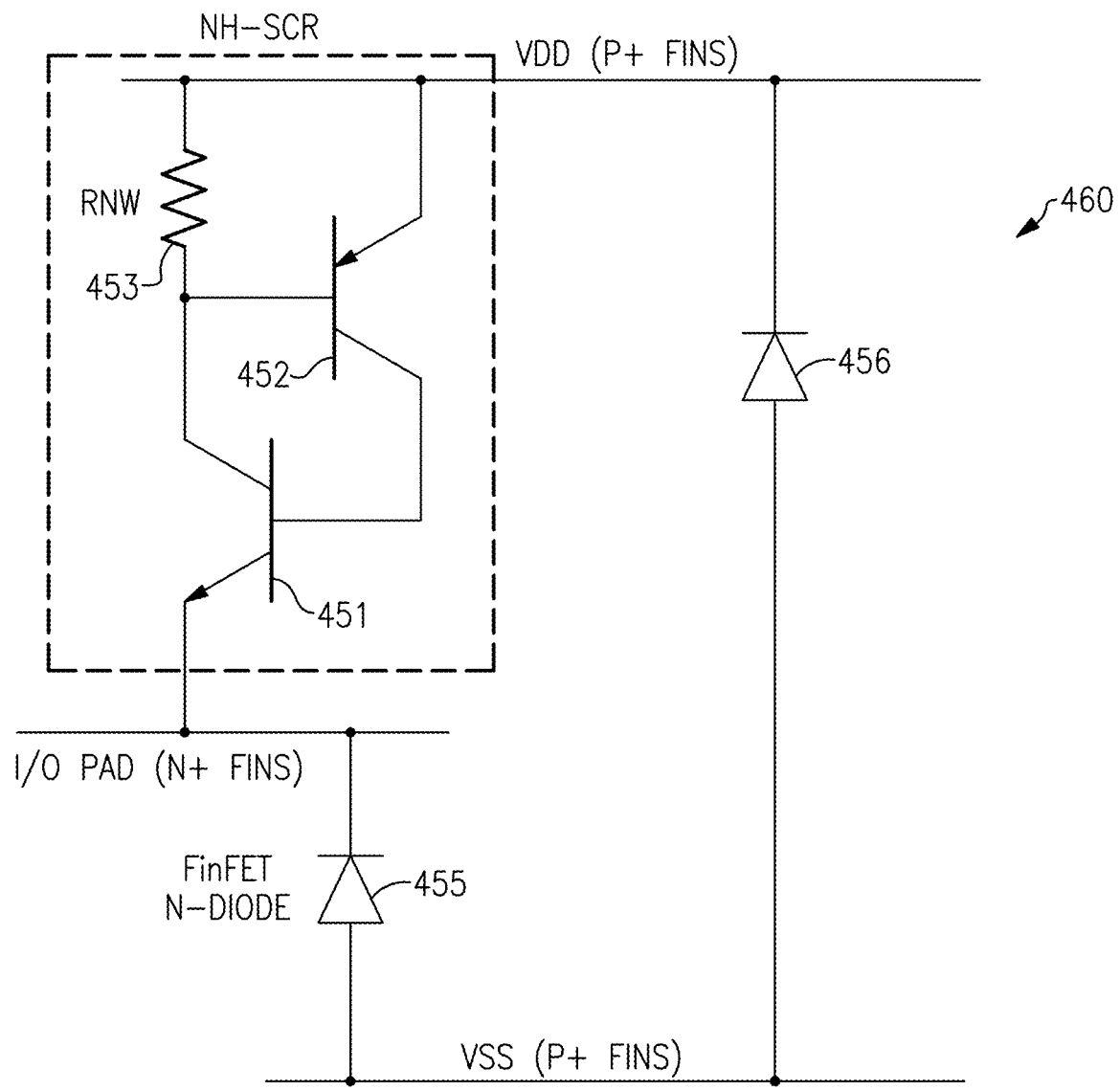
FIG. 9C is a circuit diagram of the FinFET SCR of FIG. 9A.

FIG. 9A is a perspective view of a FinFET SCR 460 according to one embodiment. FIG. 9B is a cross-section of the FinFET SCR 460 of FIG. 9A taken along the lines 9B-9B. FIG. 9C is a circuit diagram of the FinFET SCR 460 of FIG. 9A.

With reference to FIGS. 9A-9C, the FinFET SCR 460 is formed in the substrate 401, and includes N+ fins 402, P+ fins 403, STI regions 404, gates 405, PW 421, NW 422, power high (VDD) electrode 431, power low (VSS) electrode 432, and signal pad electrode 433.

As shown FIG. 9B, the FinFET SCR 460 operates as a protection circuit including an NPN bipolar transistor 451, a PNP bipolar transistor 452, an NW resistor 453, an N+ fin/PW diode 455 (also referred to as an embedded FinFET N-diode), and a PW/NW diode 456. The NPN bipolar transistor 451 and the PNP bipolar transistor 452 are cross-coupled to operate as an SCR or thyristor. The FinFET SCR 460 is an n-type FinFET SCR (NH SCR).

To provide electrical overstress protection, the VDD electrode 431, the VSS electrode 432, and the signal electrode 433 are electrically connected to a power high pad, a power low pad, and a signal pad, respectively.

Figure 10C:
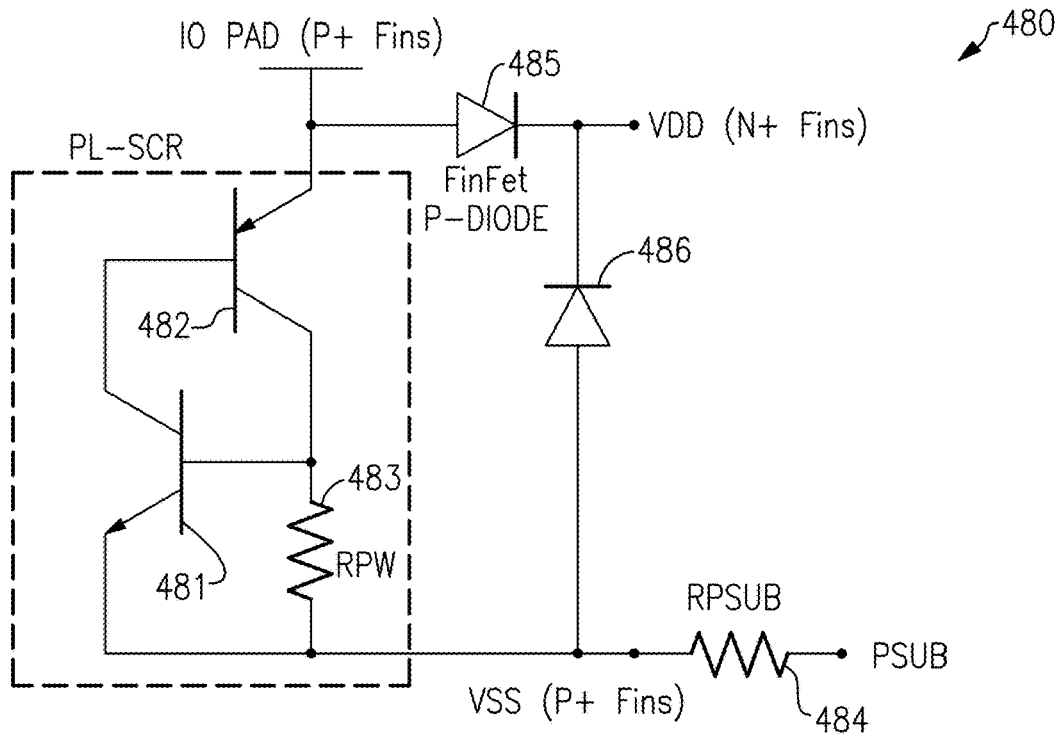
FIG. 10C is a circuit diagram of the FinFET SCR of FIG. 10A.

FIG. 10A is a perspective view of a FinFET SCR 480 according to another embodiment. FIG. 10B is a cross-section of the FinFET SCR 480 of FIG. 10A taken along the lines 10B-10B. FIG. 10C is a circuit diagram of the FinFET SCR 480 of FIG. 10A.

With reference to FIGS. 10A-10C, the FinFET SCR 480 is formed in the substrate 401, and includes N+ fins 402, P+ fins 403, STI regions 404, gates 405, PW 421, NW 422, VDD electrode 431, VSS electrode 432, and signal pad electrode 433.

As shown FIG. 10B, the FinFET SCR 480 operates as a protection circuit including an NPN bipolar transistor 481, a PNP bipolar transistor 482, a PW resistor 483, a P+ fin/NW diode 485 (also referred to as an embedded FinFET P-diode), and a PW/NW diode 486. The NPN bipolar transistor 481 and the PNP bipolar transistor 482 are cross-coupled to operate as an SCR. The FinFET SCR 480 is a p-type FinFET SCR (PL SCR).

To provide electrical overstress protection, the VDD electrode 431, the VSS electrode 432, and the signal electrode 433 are electrically connected to a power high pad, a power low pad, and a signal pad, respectively.

Figure 11A:
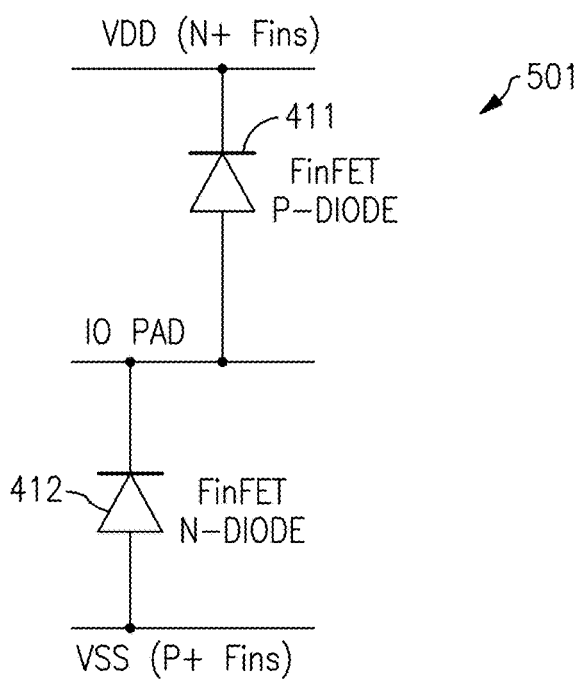
FIG. 11A is a circuit diagram of a signal pad protected with a p-type FinFET diode for forward protection and with an n-type FinFET diode for reverse protection.

FIG. 11A is a circuit diagram of a signal pad (IO PAD) protected with a p-type FinFET diode 411 for forward protection and with an n-type FinFET diode 412 for reverse protection. The configuration 501 of FIG. 11A represents a selection of a configurable overstress protection array in which the p-type FinFET diode 411 and the n-type FinFET diode 412 are selected.

As shown in FIG. 11A, the p-type FinFET diode 411 includes an anode electrically connected to the signal pad and a cathode electrically connected to the power high pad (VDD). Additionally, the n-type FinFET diode 412 includes an anode electrically connected to the power low pad (VSS) and a cathode electrically connected to the signal pad.

Figure 11B:
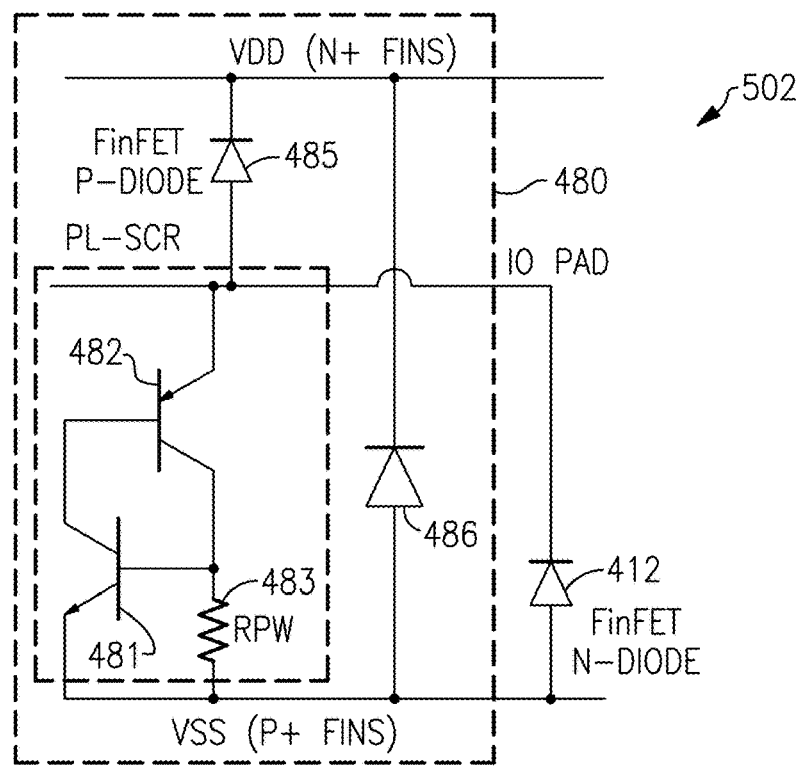
FIG. 11B is a circuit diagram of a signal pad protected with the FinFET SCR of FIGS. 10A-10C for forward protection and with an n-type FinFET diode for reverse protection.

FIG. 11B is a circuit diagram of a signal pad protected with the FinFET SCR 480 of FIGS. 10A-10C for forward protection and with an n-type FinFET diode 412 for reverse protection. The configuration 502 of FIG. 11B represents a selection of a configurable overstress protection array in which the FinFET SCR 480 and the n-type FinFET diode 412 are selected.

As shown in FIG. 11B, the FinFET SCR 480 is connected as was described above with reference to FIGS. 10A-10C. Additionally, the n-type FinFET diode 412 includes an anode electrically connected to the power low pad and a cathode electrically connected to the signal pad.

Figure 11C:
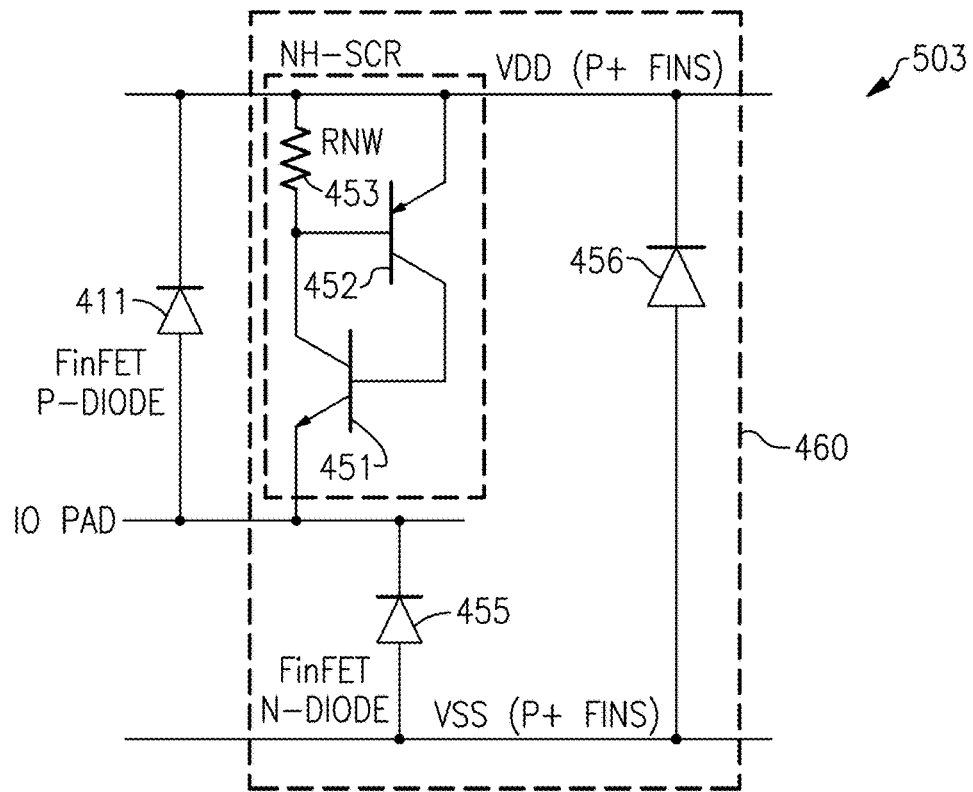
FIG. 11C is a circuit diagram of a signal pad protected with a p-type FinFET diode for forward protection and with the FinFET SCR of FIGS. 9A-9C for reverse protection.

FIG. 11C is a circuit diagram of a signal pad protected with a p-type FinFET diode 411 for forward protection and with the FinFET SCR 460 of FIGS. 9A-9C for reverse protection. The configuration 503 of FIG. 11C represents a selection of a configurable overstress protection array in which the p-type FinFET diode 411 and the FinFET SCR 460 are selected.

As shown in FIG. 11C, the p-type FinFET diode 411 includes an anode electrically connected to the signal pad and a cathode electrically connected to the power high pad. Additionally, the FinFET SCR 460 is connected as was described above with reference to FIGS. 9A-9C.

Figure 11D:
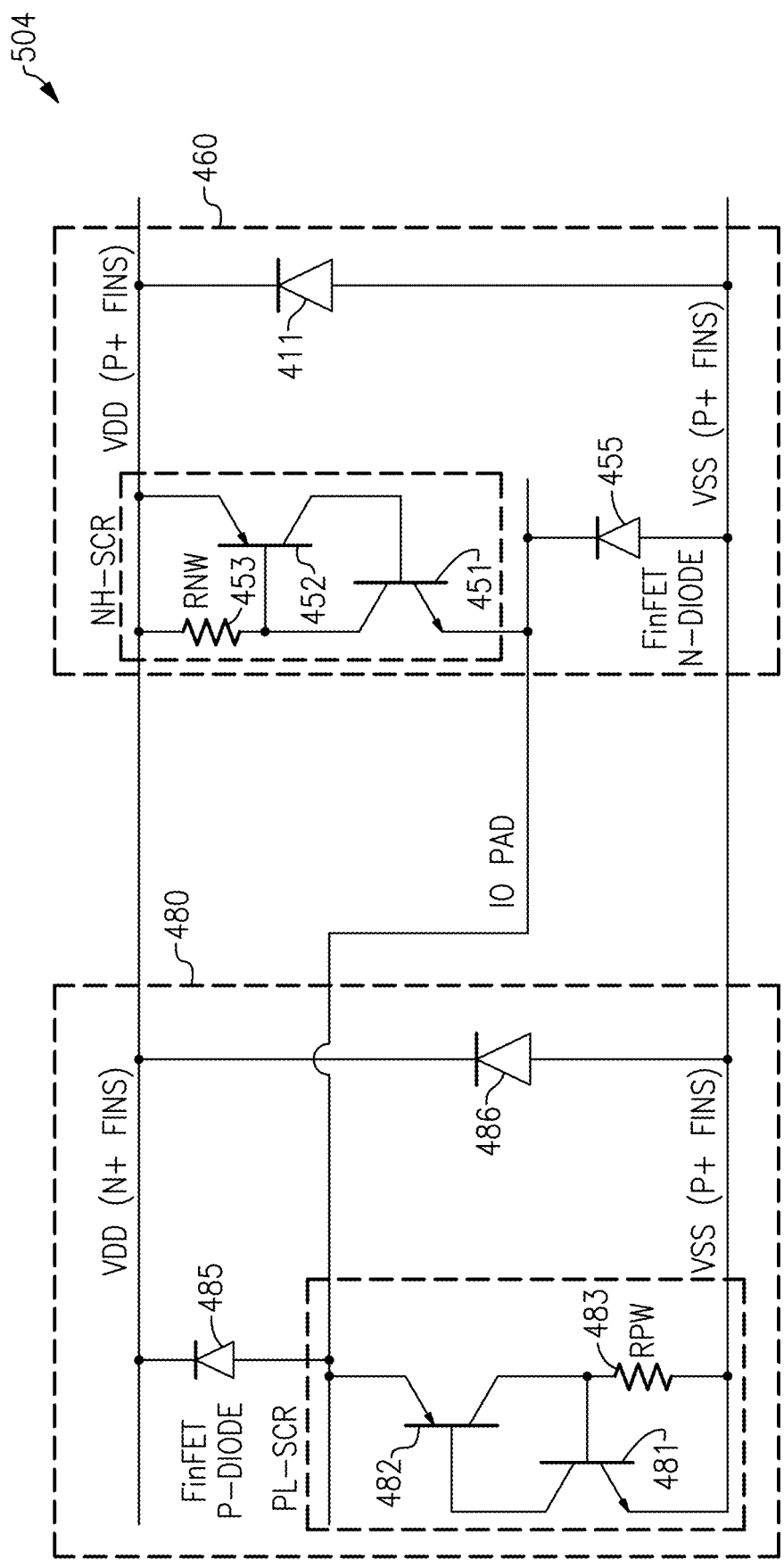
FIG. 11D is a circuit diagram of a signal pad protected with the complemented FinFET SCR of FIGS. 10A-10C for forward protection and with the FinFET SCR of FIGS. 9A-9C for reverse protection.

FIG. 11D is a circuit diagram of a signal pad protected with the complemented FinFET SCR 480 of FIGS. 10A-10C for forward protection and with the FinFET SCR 460 of FIGS. 9A-9C for reverse protection. The configuration 504 of FIG. 11D represents a selection of a configurable overstress protection array in which the FinFET SCR 480 and the FinFET SCR 460 are selected.

As shown in FIG. 11D, the FinFET SCR 480 is connected as was described above with reference to FIGS. 10A-10C. Additionally, the FinFET SCR 460 is connected as was described above with reference to FIGS. 9A-9C.

FIG. 12A is a schematic diagram of a receiver circuit 710 according to one embodiment. The receiver circuit 710 includes a first n-type metal oxide semiconductor (NMOS) FinFET 701 (M1), a second NMOS FinFET 702 (M2), a third NMOS FinFET 703 (M3), a fourth NMOS FinFET 704 (M4), and a coupling capacitor 705 (C2).

As shown in FIG. 12A, the gate of the first NMOS FinFET 701 receives an input voltage (Vin), and the source of the first NMOS FinFET 701 controls an output voltage (Vout). Additionally, the second NMOS FinFET 702 is electrically connected in series with the first NMOS FinFET 701 between the power high voltage ($V_{DD}$) and the output voltage, while the third NMOS FinFET 703 and the fourth NMOS FinFET 704 are electrically connected in series between the output voltage and the power low voltage ($V_{SS}$). The gates of the third NMOS FinFET 703 and the fourth NMOS FinFET 704 are biased by gate bias voltages Vb3 and Vb4, respectively, while the coupling capacitor 706 couples the input voltage to the gate of the second NMOS FinFET 702.

The receiver circuit 710 illustrates one embodiment of a core circuit for a chip interface, such as the chip interface 200 of FIG. 4. For example, the receiver circuit 710 can be used to process an input voltage received from an input signal pad, such as the input signal pad 121 of FIG. 4. Although the receiver circuit 710 illustrates one embodiment of a receiver circuit, the teachings herein are applicable to chip interfaces using other implementations of core circuitry.

FIG. 12B is a schematic diagram of a receiver circuit 730 according to another embodiment. The receiver circuit 730 includes a first NMOS FinFET transistor 711, a second NMOS FinFET 712, a first p-type metal oxide semiconductor (PMOS) FinFET 713, a second PMOS FinFET 714, a first coupling capacitor 721, a second coupling capacitor 722, a third coupling capacitor 723, and a fourth coupling capacitor 724. The receiver circuit 730 receives an input voltage ($V_{in}$) and outputs an output voltage ($V_{out}$).

As shown in FIG. 12B, the first NMOS FinFET 711 and the second NMOS FinFET 712 are electrically connected between the output voltage and a power high supply (AVDD) for an analog domain. Additionally, the first PMOS FinFET 713 and the second PMOS FinFET 714 are electrically between the output voltage and a power low supply (AVSS) for the analog domain, in this example. The first coupling capacitor 721 is electrically between the input voltage and the gate of the first NMOS FinFET 711, and the second coupling capacitor 722 is electrically connected between the gate of the first NMOS FinFET 711 and the gate of the second NMOS FinFET 712. Additionally, the third coupling capacitor 723 is electrically connected between the input voltage and the gate of the first PMOS FinFET 713, and the fourth coupling capacitor 724 is electrically connected between the gate of the first PMOS FinFET 713 and the gate of the second PMOS FinFET 714.

The receiver circuit 730 illustrates another embodiment of a core circuit for a chip interface, such as the chip interface 200 of FIG. 4. For example, the receiver circuit 730 can be used to process an input voltage received from an input signal pad, such as the input signal pad 121 of FIG. 4. Although the receiver circuit 730 illustrates one embodiment of a receiver circuit, the teachings herein are applicable to chip interfaces using other implementations of core circuitry.

FIG. 12C is a schematic diagram of a receiver circuit 740 according to another embodiment. The receiver circuit 740 of FIG. 12C is similar to the receiver circuit 730 of FIG. 12B, except that the receiver circuit 740 further includes a first protection NMOS FinFET 731, a second protection NMOS FinFET 732, a first protection diode 733, and a second protection diode 734.

By including additional protection circuitry, the receiver circuit 740 operates with enhanced robustness against electrical overstress relative to the receiver circuits of FIGS. 12B and 12C.

In the illustrated embodiment, the first protection NMOS FinFET 731 includes a source, a body, and a gate electrically connected to a source, a body, and a gate, respectively, of the first NMOS FinFET 711. Additionally, the first protection NMOS FinFET 731 includes a drain electrically connected to the gate of the first NMOS FinFET 711, thereby operating to protect the first NMOS FinFET 711 from damage by limiting the transistor's gate-to-source voltage. The second protection NMOS FinFET 732 includes a source, a body, and a gate electrically connected to a source, a body, and a gate, respectively, of the second NMOS FinFET 712. Additionally, the second protection NMOS FinFET 732 includes a drain electrically connected to the gate of the second NMOS FinFET 712 to provide protection.

The first protection NMOS FinFET 731 serves to protect the first NMOS FinFET 711, while the second protection NMOS FinFET 732 serves to protection the second NMOS FinFET 712. In certain implementations, an MOS protection transistor is integrated into a layout of a corresponding MOS transistor. In one example, a multi-finger transistor layout includes a first portion of fingers electrically connected to form the first NMOS FinFET 711 and a second portion of the fingers electrically connected to form the first protection NMOS FinFET 731. Accordingly, in certain implementations, a MOS protection transistor is formed using one or more fingers of a multi-finger layout used to form a corresponding MOS transistor.

With continuing reference to FIG. 12C, the first protection diode 733 is electrically connected between the gate and source of the first PMOS FinFET 713, while the second protection diode 734 is electrically connected between the gate and source of the second NMOS transistor 714. The first protection diode 733 serves to limit a gate-to-source voltage of the first PMOS FinFET 713, thereby helping to prevent gate oxide breakdown. Likewise, the second protection diode 734 serves to limit a gate-to-source voltage of the second PMOS FinFET 714.

In certain implementations, the first protection diode 733 and/or the second protection diode 734 are implemented as FinFET diodes, for instance, FinFET P-diodes.

By including integrated protection devices (for instance, protection transistors and/or protection didoes) in a receiver or other core circuit of a chip interface, auxiliary protection is provided against electrical overstress. Such protection devices can operate in combination with a configurable overstress protection array to provide secondary protection to the core circuitry, thereby enhancing robustness.

In certain implementations, integrated protection devices are segmented and programmable. For example, a protection diode (for instance, the first protection diode 733 and/or the second protection diode 734) and/or a protection FinFET (for instance, the first protection NMOS FinFET 731 and/or the second protection NMOS FinFET 732) can be segmented and programmable in accordance with the teachings herein.

Figure 13A:
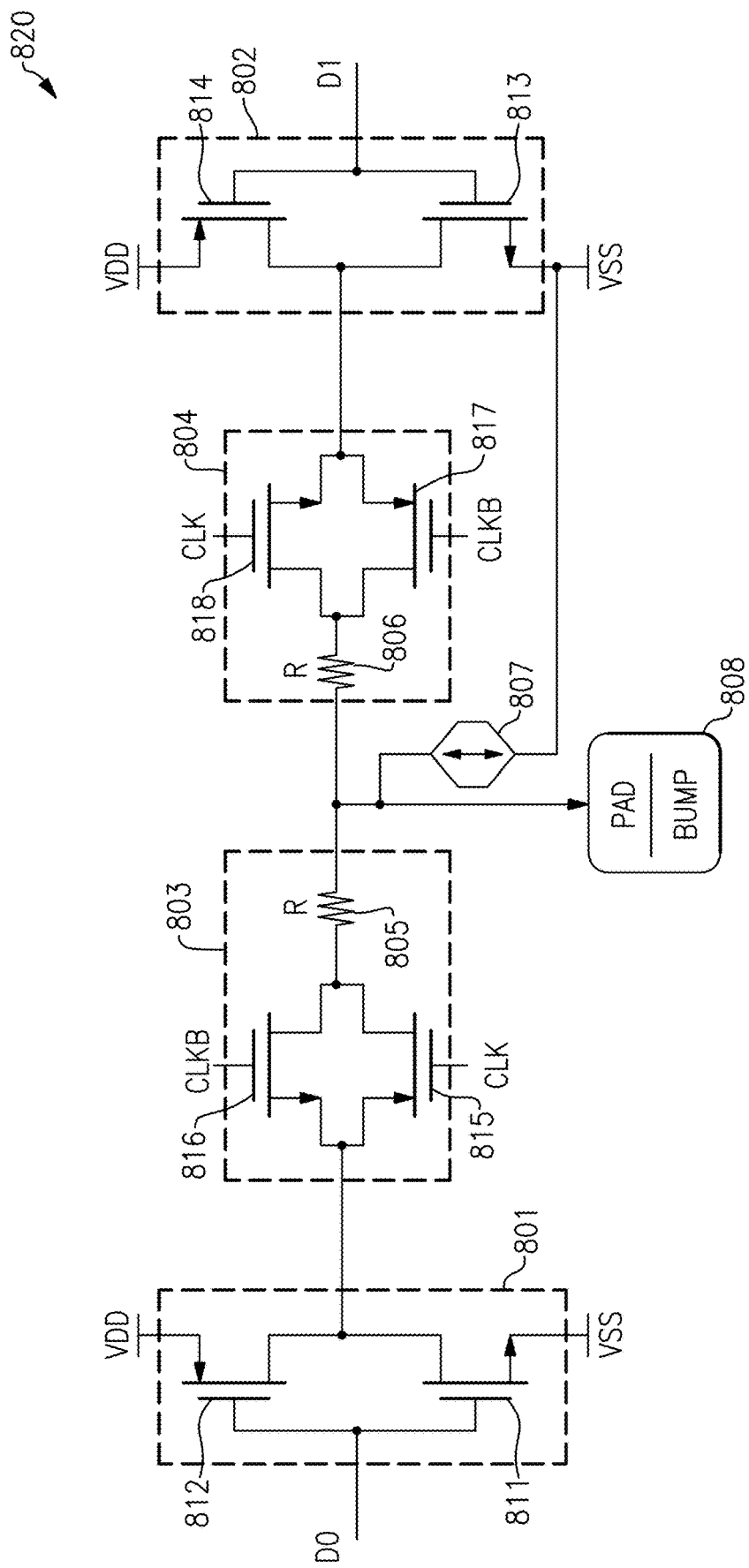
FIG. 13A is a schematic diagram of a transmitter circuit according to one embodiment.

FIG. 13A is a schematic diagram of a transmitter circuit 820 according to one embodiment. The transmitter circuit 820 includes a first driver circuit 801, a second driver circuit 802, a first pass gate circuit 803, and a second pass gate circuit 804. As shown in FIG. 13A, the transmitter circuit 820 drives an output signal pad 808 that is protected by a primary forward overstress protection circuit 807. In certain implementations, the primary forward overstress protection circuit 807 is implemented using a configurable overstress protection array.

The transmitter circuit 820 illustrates another embodiment of a core circuit for a chip interface, such as the chip interface 200 of FIG. 4. For example, the transmitter circuit 820 can be used to control an output voltage of an output signal pad, such as the output signal pad 122 of FIG. 4. Although the transmitter circuit 820 illustrates one embodiment of a transmitter circuit, the teachings herein are applicable to chip interfaces using other implementations of core circuitry.

The first driver circuit 801 and second driver circuit 802 are powered by a power high supply (VDD) and a power low supply (VSS). Additionally, the first driver circuit 801 includes a first NMOS FinFET 811 and a first PMOS FinFET 812, and operates to provide an inverted version of a digital input signal D0 to the first pass gate circuit 803. The second driver circuit 802 includes a second NMOS FinFET 813 and a second PMOS FinFET 814, and operates to provide an inverted version of a digital input signal D1 to the second pass gate circuit 804.

With continuing reference to FIG. 13A, the first pass gate circuit 803 includes a first PMOS pass FinFET 815 controlled by a clock signal (CLK), a first NMOS pass FinFET 816 controlled by an inverted clock signal (CLKB), and a first ballast resistor 805. Additionally, the second pass gate circuit 804 includes a second PMOS pass FinFET 817 controlled by the inverted clock signal, a second NMOS pass FinFET 818 controlled by the clock signal, and a second ballast resistor 806.

In the illustrated embodiment, the first pass gate circuit 803 and the second pass gate circuit 804 each include a ballast resistor of resistance R to provide secondary protection beyond the overstress protection provided by the primary forward overstress protection circuit 807. As shown in FIG. 13A, the first ballast resistor 805 is interposed between the output signal pad 808 and the drains of the first PMOS pass FinFET 815 and the first NMOS pass FinFET 816. Additionally, the second ballast resistor 806 is interposed between the output signal pad 808 and the drains of the second PMOS pass FinFET 817 and the second NMOS pass FinFET 818.

Figure 13B:
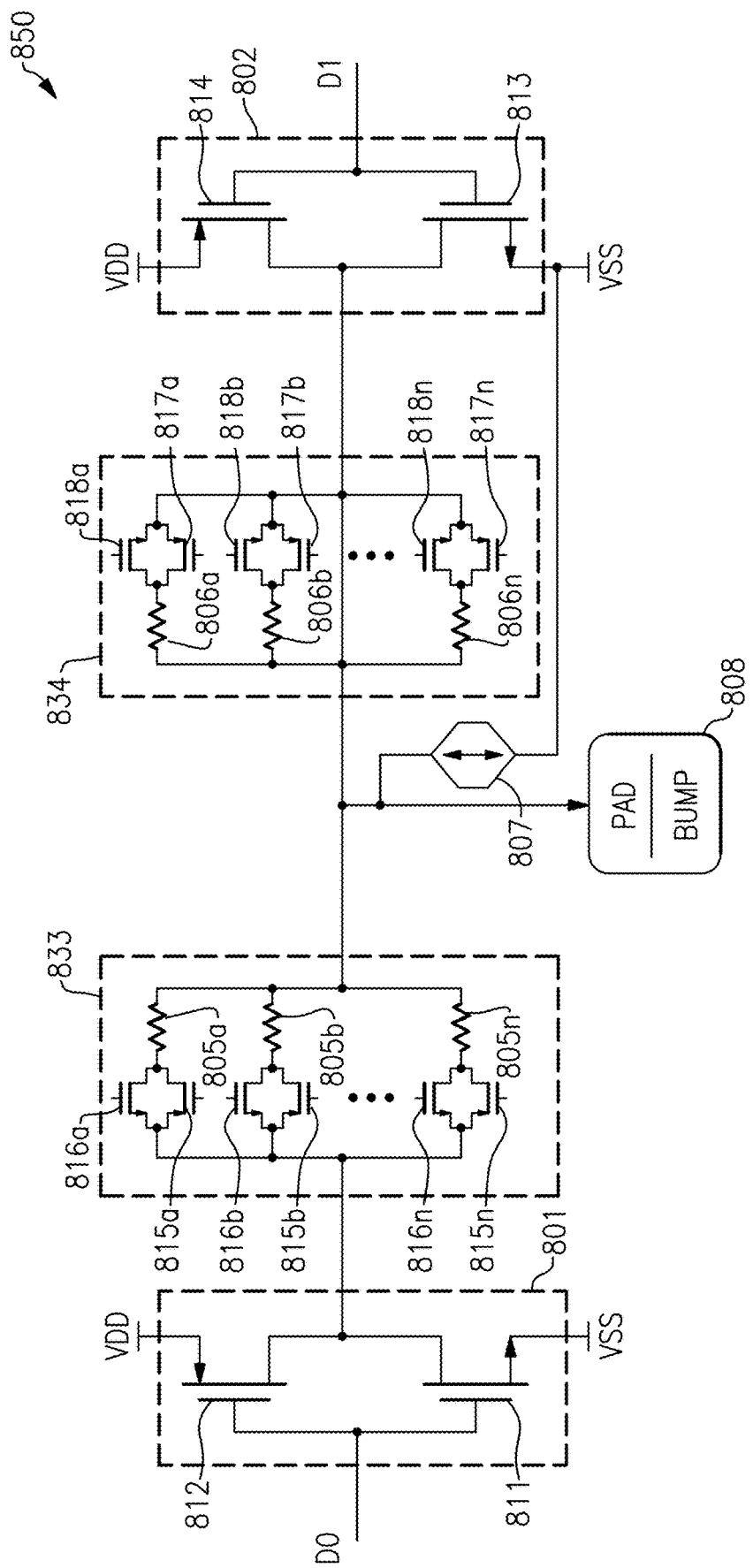
FIG. 13B is a schematic diagram of a transmitter circuit according to another embodiment.

FIG. 13B is a schematic diagram of a transmitter circuit 850 according to another embodiment. The transmitter circuit 850 includes a first driver circuit 801, a second driver circuit 802, a first pass gate circuit 833, and a second pass gate circuit 834. As shown in FIG. 13B, the transmitter circuit 850 drives an output signal pad 808 that is protected by a primary forward overstress protection circuit 807.

The transmitter circuit 850 of FIG. 13B is similar to the transmitter circuit 820 of FIG. 13A, except that the transmitter circuit 850 includes an implementation of pass gate circuits implemented using segmented ballasting to enhance robustness against electrical overstress.

In particular, the first pass gate circuit 833 of FIG. 13B includes n ballast resistors 805a, 805b, . . . 805n, where n is an integer greater than or equal to 2. Additionally, the first pass gate circuit 833 includes n PMOS pass gate FinFETs 815a, 815b, . . . 815n and n NMOS pass gate FinFETs 816a, 816b, . . . 816n. Furthermore, the second pass gate circuit 834 of FIG. 13B includes n ballast resistors 806a, 806b, . . . 806n, n PMOS pass gate FinFETs 817a, 817b, . . . 817n and n NMOS pass gate FinFETs 818a, 818b, . . . 818n.

Segmenting a ballast resistor as shown for the transmitter circuit 850 of FIG. 13B enhances robustness relative to the transmitter circuit 820 of FIG. 13A. For example, by segmenting a ballast resistor of resistance R into n parallel resistors of resistance n*R, each ballast resistor provides greater resistance for inhibiting the flow of current into the transmitter circuit 850 during overstress, while maintaining about the same total ballast resistance. Accordingly, enhanced robustness is achieved with little to no impact on signaling performance arising from the presence of resistance in the signal path.

Figure 14:
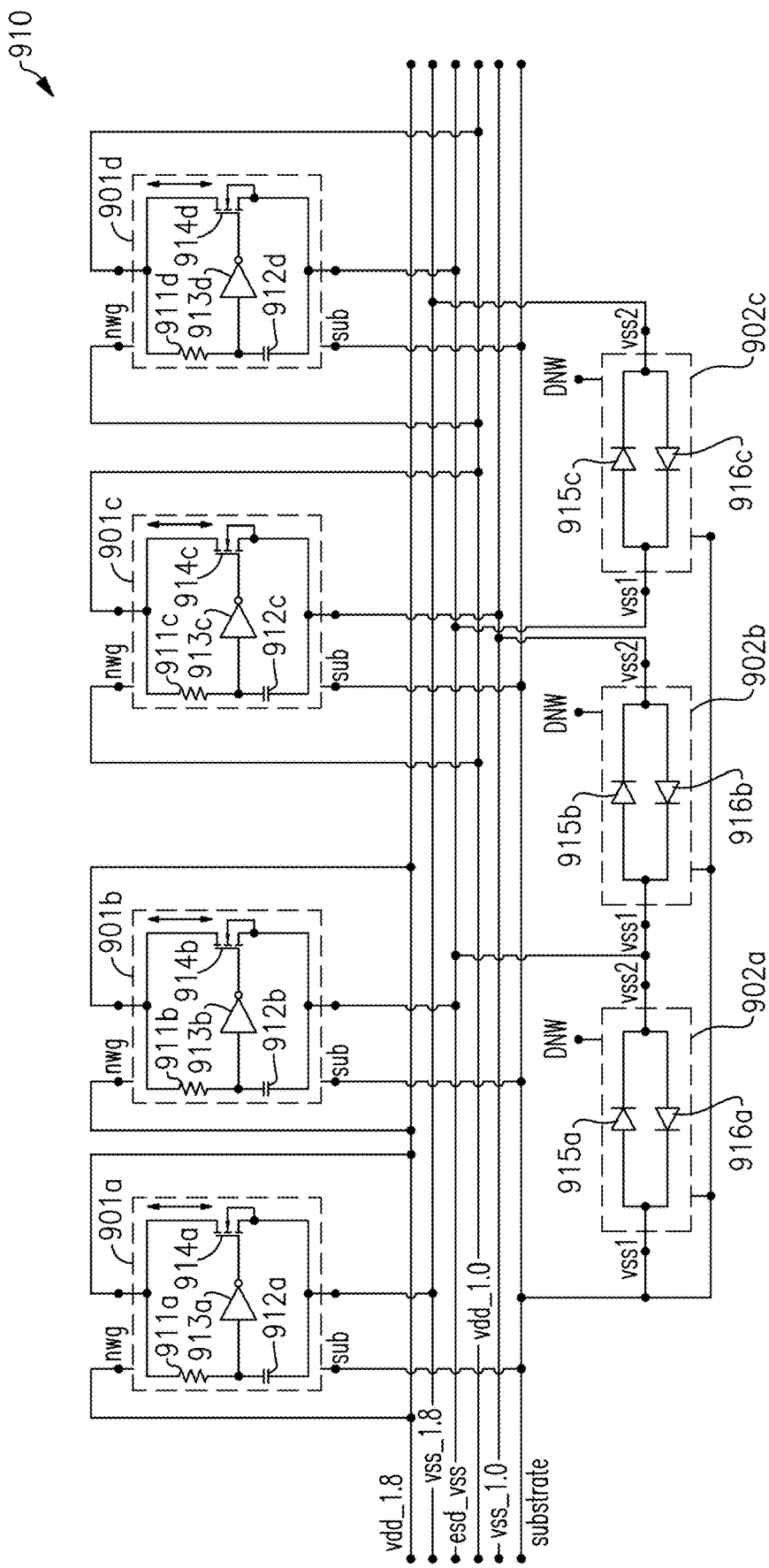
FIG. 14 is a schematic diagram of a supply clamp array according to one embodiment.

FIG. 14 is a schematic diagram of a supply clamp array 910 according to one embodiment. The supply clamp array 910 includes a first active supply clamp 901a, a second active supply clamp 901b, a third active supply clamp 901c, a fourth active supply clamp 901d, a first cross-domain power low overstress protection circuit 902a, a second cross-domain power low overstress protection circuit 902b, and a third cross-domain power low overstress protection circuit 902c.

The supply clamp array 910 includes protection clamps between various power high and power low or ground supplies of a chip interface. In this example, the chip interface includes a power high supply for a 1.8 V domain (vdd_1.8), a power low supply for the 1.8 V domain (vss_1.8), a power high supply for a 1.0 V domain (vdd_1.0), a power low supply for the 1.0 V domain (vss_1.0), a power low supply for overstress (esd_vss), and a power low supply for the substrate (substrate).

Although one example of protection circuitry between various power high and power low supplies is shown, the teachings herein are applicable to protection circuitry implemented in other ways.

In the illustrated embodiment, the active supply clamps 901a-901d include detection resistors 911a-911d, respectively, detection capacitors 912a-912d, respectively, driver circuits 913a-913d, respectively, and clamp transistors 914a-914d (for instance, NMOS FinFETs), respectively. Additionally, each of the active supply clamps 901a-901d includes an n-well guard ring (nwg) terminal for connecting to an embedded n-well guard ring and a substrate terminal (sub) for connecting to a substrate voltage.

An actively-controlled supply clamp is a type of supply clamp that detects for the presence of an electrical overstress event by monitoring for electrical conditions associated with overstress. By implementing a supply clamp with active control, relatively fast activation times, relatively low static power dissipation, and/or relatively compact area can be achieved relative to an implementation that relies on native junction breakdown to provide clamping.

In the illustrated embodiment, each of the active supply clamps 901a-901d includes a detection resistor and a detection capacitor that generate a detection signal in response to detecting electrical overstress between a power high supply and a power low supply that the active supply clamp is connected between. Additionally, each of the active supply clamps 901a-901d further includes a clamp transistor and a driver circuit that turns on the clamp transistor in response to activation of the detection signal. Although one embodiment of active supply clamps is shown, other implementations of active supply clamps are possible.

The active supply clamps 901a-901d are connected to different combinations of power high supplies and power low supplies to provide cross-domain protection. For example, the first active supply clamp 901a is electrically connected between vdd_1.8 and vss_1.8, the second active supply clamp 901b is electrically connected between vdd_1.8 and esd_vss, the third active supply clamp 901c is electrically connected between vdd_1.0 and vss_1.0, and the fourth active supply clamp 901d is electrically connected between vdd_1.0 and esd_vss. The active supply clamps 901a-901d operate with built-in bidirectional conduction capability, in this example.

In the illustrated embodiment, the cross-domain power low overstress protection circuits 902a-902c include first diodes 915a-915c, respectively, and second diodes 916a-916c, respectively, with each corresponding pair of diodes connected in anti-parallel between a first power low supply terminal (vss1) and a second power low supply terminal (vss2). Additionally, each of the cross-domain power low overstress protection circuits 902a-902c includes a deep n-well (DNW) terminal for connecting to an embedded deep n-well isolation tub and a substrate terminal for connecting to a substrate voltage. In certain implementations, the DNW terminals are electrically floating to enhance isolation.

The cross-domain power low overstress protection circuits 902a-902c are connected between different combinations of power low supplies to provide cross-domain protection. For example, the first active supply clamp 902a is electrically connected between the power low supply for the substrate and esd_vss, the second active supply clamp 902b is electrically connected between esd_vss and vss_1.0, and third active supply clamp 902c is electrically connected between esd_vss and vss_1.8.

The active supply clamps 901a-901d and/or the cross-domain power low overstress protection circuits 902a-902c can be implemented in accordance with any of the embodiments herein.

Figure 15A:
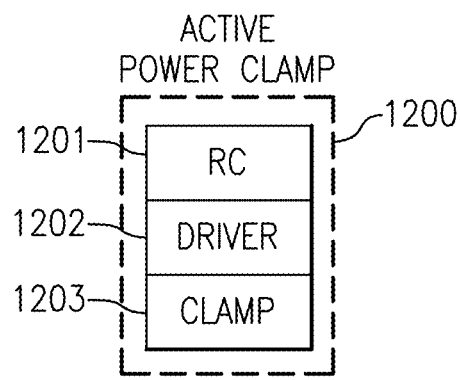
FIG. 15A is a schematic diagram of an active supply clamp according to one embodiment.

FIG. 15A is a schematic diagram of an active supply clamp 1200 according to one embodiment. The active supply clamp 1200 includes a resistor-capacitor (RC) detection circuit 1201, a driver circuit 1202, and a clamp circuit 1203.

The active supply clamp 1200 is connectable between a power high pad and a power low pad. Additionally, the RC detection circuit 1202 monitors a change in a voltage difference between the power high pad and the power low pad over time, and activates a detection signal in response to detecting electrical overstress between the power high pad and the power low pad. The driver circuit 1202 receives the detection signal, and turns on the clamp circuit 1203 when the detection signal is activated and turns off the clamp circuit 1203 when the detection signal is deactivated. Accordingly, in response to an electrical overstress event, the clamp circuit 1203 turns on to provide a discharge path between the power high pad and the power low pad, thereby alleviating overstress conditions.

Figure 15B:
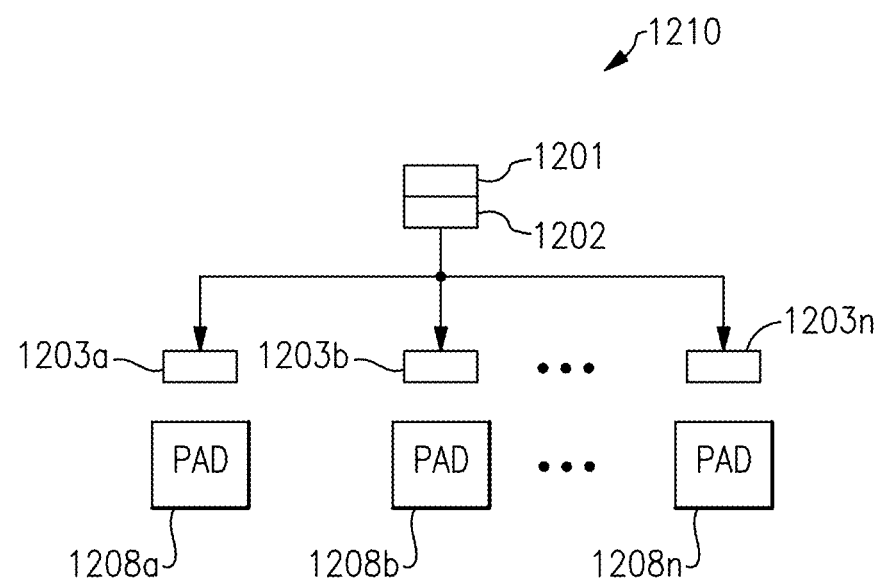
FIG. 15B is a schematic diagram of a distributed active supply clamp according to one embodiment.

FIG. 15B is a schematic diagram of a distributed active supply clamp 1210 according to one embodiment. The distributed active supply clamp 1210 includes an RC detection circuit 1201, a driver circuit 1202, and distributed clamp circuits 1203a, 1203b, . . . 1203n.

As shown in FIG. 15B, the distributed clamp circuits 1203a, 1203b, . . . 1203n are placed in proximity to the pads 1208a, 1208b, . . . 1208n, respectively, thereby providing clamping local to each pad. Distributing the active supply clamp in this manner provides a number of advantages, such as enhanced robustness due to localized protection and/or smaller layout due to shared detection and/or driver circuitry. In certain implementations, the pads 1208a, 1208b, . . . 1208n are power high pads that are connected to one another to form a power high rail, which can be used to provide power to any of the core circuits herein.

Although one driver circuit 1202 is shown, is shown, other configurations are possible. In one example, a driver circuit is implemented as a tree of inverters or other circuits used to provide detection signal distribution across the chip interface.

Figure 16A:
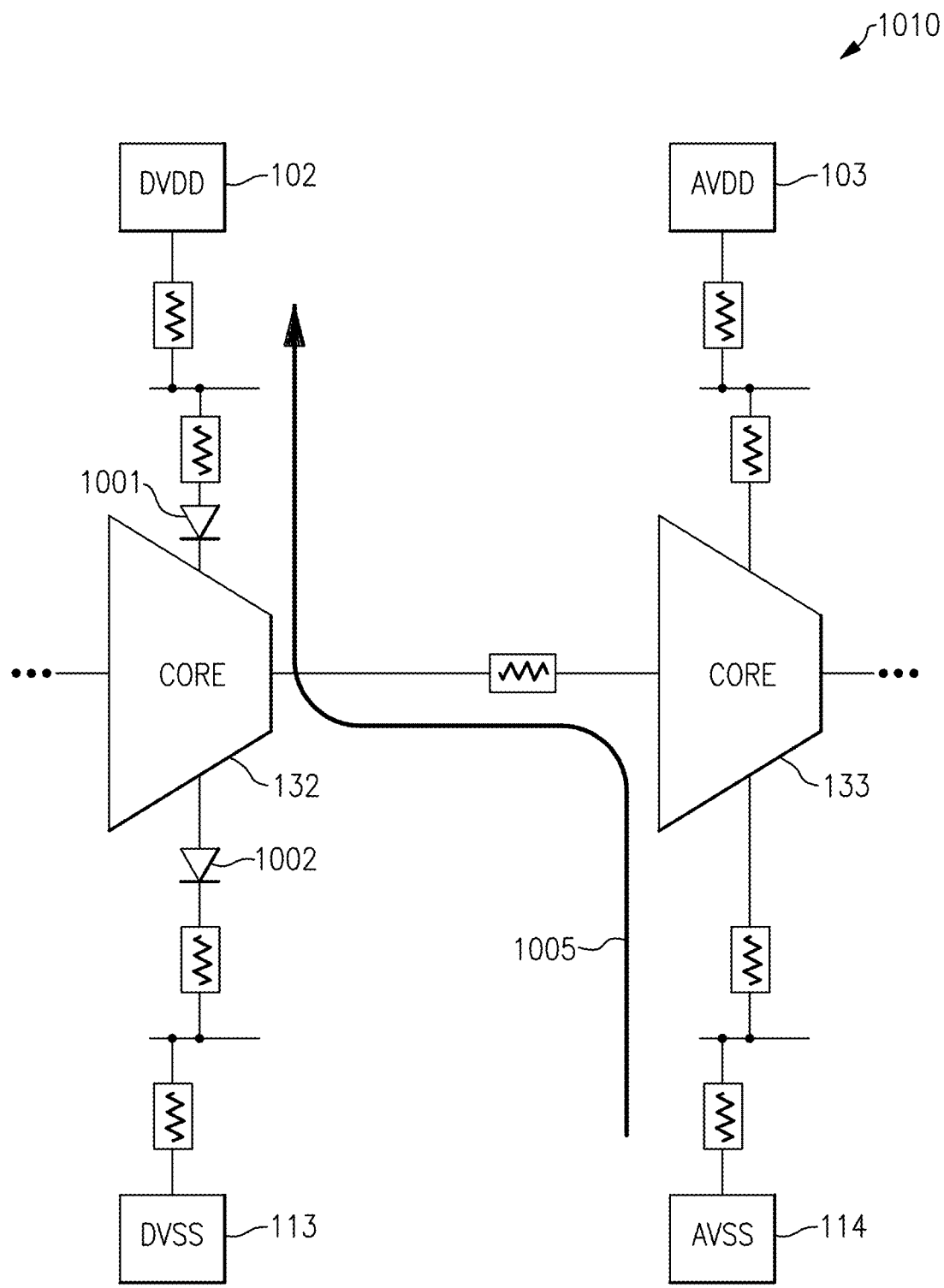
FIG. 16A is a schematic diagram of cross-domain communication circuitry with electrical overstress blocking elements according to one embodiment.

FIG. 16A is a schematic diagram of cross-domain communication circuitry 1010 with electrical overstress blocking elements according to one embodiment. The cross-domain communication circuitry 1010 includes a power high pad 102 for a digital domain (DVDD), a power low pad 113 for the digital domain (DVSS), a power high pad 103 for an analog domain (AVDD), a power low pad 114 for the analog domain (AVSS), a digital core circuit 132, an analog core circuit 133, a first protection diode 1001 and a second protection diode 1002. Furthermore, various resistors associated with resistances of metallization used in routing are shown. The first protection diode 1001 and a second protection diode 1002 are also referred to herein as blocking diodes.

The cross-domain communication circuitry 1010 illustrates one embodiment of circuitry for communicating between one power domain and another power domain of a chip. For example, the cross-domain communication circuitry 1010 represents one embodiment of a portion of the chip interface 200 of FIG. 4 between digital and analog power domains.

Absent protection, certain electrical overstress events, such as FICDM events can lead to a flow of charge from the power low pad of one power domain to the power high pad of another power domain. For example, the cross-domain communication circuitry 1010 of FIG. 16A has been annotated to shown an example current path 1005 between AVSS and DVDD. Such a flow of charge can lead to damage to circuitry along the current path, such as transmitter and/or receiver circuits. For instance, the gate oxide of MOS FinFET transistors of the transmitter and/or receiver circuits can be damaged by FICDM or other overstress.

In the illustrated embodiment, the first protection diode 1001 has been included to block the flow of charge between AVSS and DVDD, and the second protection diode 1002 has been included to block the flow of charge between DVSS and AVDD. Although not shown in FIG. 16A, in certain implementations, a protection diode is included between AVDD and the analog core circuit 133 to block the flow of charge from DVSS to AVDD and/or a protection diode is included between AVSS and the analog core circuit 133 to block the flow of charge from AVSS to DVDD.

Any of the embodiments herein can include one or more protection diodes for blocking current from flowing from a power low supply of one power domain to a power high supply of another power domain, thereby enhancing protection against FICDM events and/or other overstress.

Figure 16B:
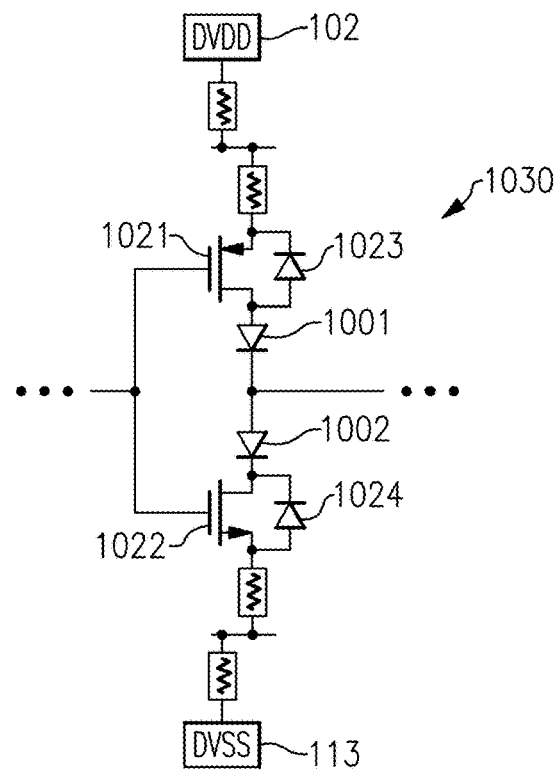
FIG. 16B is a schematic diagram of another embodiment of a portion of cross-domain communication circuitry with electrical overstress blocking elements.

FIG. 16B is a schematic diagram of another embodiment of a portion of cross-domain communication circuitry with electrical overstress blocking elements. In this embodiment, a power high pad 102 for a digital domain (DVDD), a power low pad 113 for the digital domain (DVSS), a PMOS FinFET 1021 (including a body diode 1023), an NMOS FinFET 1022 (including a body diode 1024), a first protection diode 1001 and a second protection diode 1002 are depicted.

The PMOS FinFET 1021 and the NMOS FinFET 1022 illustrate one implementation of the digital core circuit 132 of FIG. 16A. In this example, the digital core circuit 132 is implemented as a digital inverter 1030. However, other implementations of the digital core circuit are possible.

As shown in FIG. 16B, the PMOS FinFET 1021 and the first protection diode 1001 are electrically connected in series between DVDD and the output of the digital inverter 1030, while the NMOS FinFET 1022 and the second protection diode 1002 are electrically connected in series between the output of the digital inverter 1030 and DVSS. As persons of ordinary skill with appreciate, the order in the series of the PMOS FinFET 1021 and the first protection diode 1001 can be reversed. Additionally or alternatively, the order in the series of the NMOS FinFET 1022 and the second protection diode 1002 can be reversed.

The circuitry of FIG. 16B can be included in the cross-domain communication circuitry 1010 of FIG. 16A to block the flow of current between AVDD and prevent the flow of charge from AVSS to DVDD and/or to block the flow of charge from DVSS to AVDD. By including these blocking elements, overstress current that is originated from the receiver block during a field-induced stress condition does not have a direct conduction current path to the power rails through the transmitter devices, preventing the overstress in the received interface device by steering the electrical overstress away from the sensitive interface receiver thin gate oxide and through the power low and power high rails.

Figure 17:
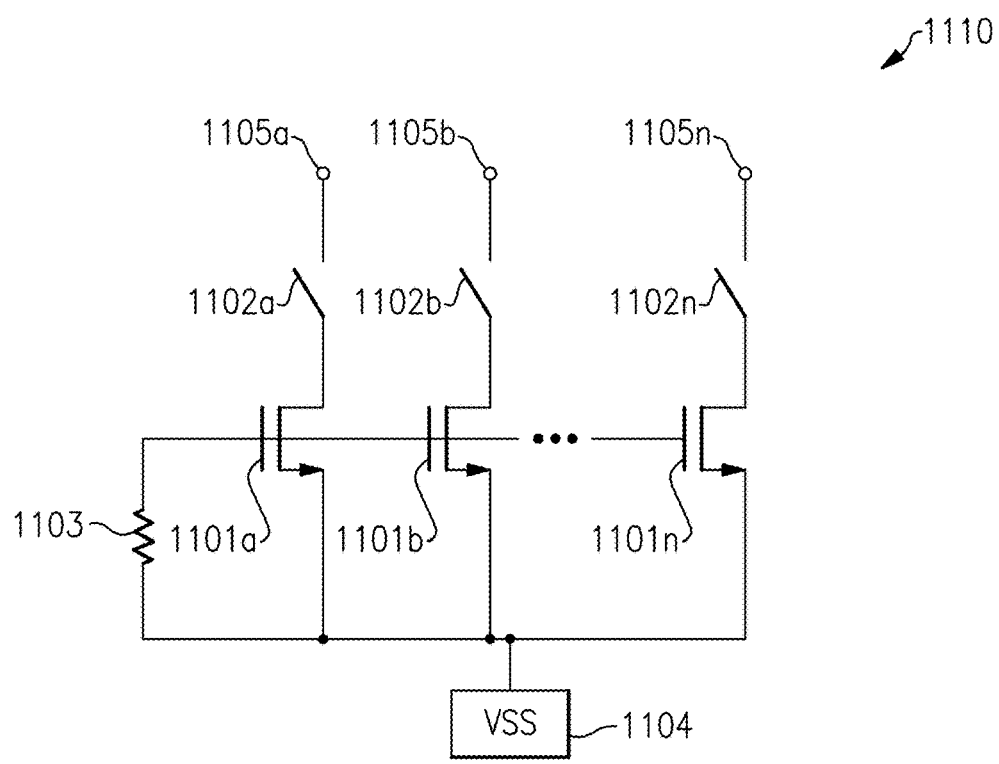
FIG. 17 is a schematic diagram of a segmented and programmable cross-domain secondary overstress protection circuit according to one embodiment.

FIG. 17 is a schematic diagram of a segmented and programmable cross-domain secondary overstress protection circuit 1110 according to one embodiment. The a cross-domain secondary overstress protection circuit 1110 includes a gate resistor 1103, configuration structures 1102a, 1102b, . . . 1102n, and protection transistors 1101a, 1101b, . . . 1101n.

The cross-domain secondary overstress protection circuit 1110 illustrates one embodiment of the cross-domain secondary overstress protection circuit 163 of FIG. 4. However, the cross-domain secondary overstress protection circuit 163 of FIG. 4 can be implemented in other ways. For instance, the gate resistors 1103 can be implemented using a different implementation of a pull-down circuit and/or other types of protection devices can be sued, for example, FinFET diodes, PMOS FinFETs, NMOS FinFETs, or a combination thereof. Furthermore, the cross-domain secondary overstress protection circuit 1110 can be included in other implementations of chip interfaces.

As shown in FIG. 17, the cross-domain secondary overstress protection circuit 1110 further includes terminals 1105a, 1105b, . . . 1105n for programmability and selectively connecting to one or more nodes for secondary overstress protection. For example, the terminals 1105a, 1105b, . . . 1105n can connect to inputs and/or outputs of core circuits of a chip interface, such as the chip interface 200 of FIG. 4. The configuration structures 1102a, 1102b, . . . 1102n are electrically connected in series with the protection transistors 1101a, 1101b, . . . 1101n between the power low pad 1104 and the terminals 1105a, 1105b, . . . 1105n, respectively.

The cross-domain secondary overstress protection circuit 1110 can be used to provide secondary cross-domain overstress protection for certain signal nodes, such as interface nodes between a digital power domain and an analog power domain or vice versa. Such interface nodes can include, but are not limited to, digital circuits communicating between one power domain and another power domain and/or cross-domain signal nodes that are not directly connected to signal pads.

As shown in FIG. 17, the cross-domain secondary overstress protection circuit 1110 includes multiple legs or segments that can be replicated or tiled as many times as needed to provide protection. For example, each of the terminals 1105a, 1105b, . . . 1105n can be connected to a particular node to be protected and/or multiple ones of the terminals 1105a, 1105b, . . . 1105n can be connected to a common node to enhance the amount of protection provided to that node.

The configuration structures 1102a, 1102b, . . . 1102n can be implemented in a wide variety of ways, including, but not limited to, using metallization, fuses, and/or switches.

Applications

Devices employing the above described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical and automotive applications.

Conclusion

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A semiconductor die with distributed and configurable electrical overstress protection, the semiconductor die comprising:
   a plurality of pads including a signal pad, a power high pad, and a power low pad;
   a core circuit electrically connected to at least the signal pad, the power high pad, and the power low pad;
   a configurable overstress protection array operable to protect the core circuit from electrical overstress at the plurality of pads, wherein the configurable overstress protection array includes a plurality of overstress protection devices of two or more different device types, wherein both a number of selected overstress protection devices and a device type of the selected overstress protection devices is programmable; and
   a secondary distributed overstress protection circuit including a gate resistor, and a plurality of transistors each having a source electrically connected to the power low pad and a gate electrically connected to the gate resistor, wherein at least one drain of the plurality of transistors is electrically connected to an output of the core circuit,
   wherein the two or more different device types comprises a first device type including a fin field-effect transistor (FinFET) thyristor connected between the signal pad and one of the power high pad or the power low pad, and a second device type including a FinFET diode connected between the signal pad and the other of the power high pad or the power low pad.

2. The semiconductor die of claim 1, wherein the FinFET thyristor and the FinFET diode share one or more common fins.

3. The semiconductor die of claim 1, wherein the FinFET thyristor comprises a power high terminal electrically connected to the power high pad and a signal terminal electrically connected to the signal pad.

4. The semiconductor die of claim 3, wherein the FinFET diode is electrically connected between the signal pad and the power low pad.

5. The semiconductor die of claim 3, wherein the power high terminal comprises a plurality of p-type active (P+) fins and the signal terminal comprises a plurality of n-type active (N+) fins.

6. The semiconductor die of claim 1, wherein the FinFET thyristor comprises a power low terminal electrically connected to the power low pad and a signal terminal electrically connected to the signal pad.

7. The semiconductor die of claim 6, wherein the FinFET diode is electrically connected between the signal pad and the power high pad.

8. The semiconductor die of claim 6, wherein the power low terminal comprises a plurality p-type active (P+) fins and the signal terminal comprises a plurality of n-type active (N+) fins.

9. A semiconductor die with distributed and configurable electrical overstress protection, the semiconductor die comprising:
  a plurality of pads including a signal pad, a power high pad, and a power low pad;
  a core circuit electrically connected to at least the signal pad, the power high pad, and the power low pad; and
  a configurable overstress protection array operable to protect the core circuit from electrical overstress at the plurality of pads, wherein the configurable overstress protection array includes a plurality of overstress protection devices of two or more different device types, wherein both a number of selected overstress protection devices and a device type of the selected overstress protection devices is programmable,
  wherein the configurable overstress protection array includes a customizable forward protection circuit electrically connected between the power high pad and the signal pad, and a customizable reverse protection circuit electrically connected between the signal pad and the power low pad, wherein the customizable forward protection circuit and the customizable reverse protection circuit are distributed across the semiconductor die.

10. The semiconductor die of claim 9, wherein the two or more different device types includes a fin field-effect transistor (FinFET) diode and a FinFET thyristor.

11. The semiconductor die of claim 10, wherein the FinFET diode includes an anode formed from a p-type active (P+) fin extending from a substrate, a cathode formed from an n-type active (N+) fin extending from the substrate, and an inter-active isolation structure between the P+fin and the N+fin or shallow trench isolation (STI) between the P+fin and the N+fin.

12. The semiconductor die of claim 11, wherein the inter-active isolation structure includes at least one of a gate between the P+fin and the N+fin or shallow trench isolation (STI) between the P+fin and the N+fin.

13. The semiconductor die of claim 10, wherein the FinFET thyristor includes an anode formed from a p-type active (P+) fin extending from a substrate, a cathode formed from an n-type active (N+) fin extending from the substrate, and an inter-active isolation structure between the P+fin and the N+fin.

14. The semiconductor die of claim 9, wherein the customizable forward protection circuit includes a first bank of single FinFET diodes, a first bank of dual FinFET diodes, and a first bank of FinFET thyristors, wherein the customizable reverse protection circuit includes a second bank of single FinFET diodes, a second bank of dual FinFET diodes, and a second bank of FinFET thyristors.

15. The semiconductor die of claim 9, wherein the core circuit comprises a FinFET transistor and at least one of (i) a segmented and programmable protection FinFET diode between a gate and a source of the FinFET transistor or (ii) a segmented and programmable protection FinFET between a gate and a source of the FinFET transistor.

16. The semiconductor die of claim 9, wherein the core circuit operates in a first power domain associated with the power high pad and the power low pad, and is in communication with a circuit of a second power domain, wherein the core circuit further includes at least one of a first blocking diode between the power high pad and an output of the core circuit or a second blocking diode between output of the core circuit and the power low pad.

17. The semiconductor die of claim 9, wherein the core circuit is coupled to a power high rail including two or more power high pads, the semiconductor die further comprising a distributed active supply clamp including two or more clamp circuits coupled to the two or more power high pads, a shared detection circuit configured to generate a detection signal in response to detecting electrical overstress on the power high rail, and a shared driver circuit configured to control the two or more clamp circuits based on the detection signal.

18. The semiconductor die of claim 9, further comprising a secondary distributed overstress protection circuit including a gate resistor, and a plurality of transistors each having a source electrically connected to the power low pad and a gate electrically connected to the gate resistor, wherein at least one drain of the plurality of transistors is electrically connected to an output of the core circuit.

19. The semiconductor die of claim 18, wherein a drain connection of each of the plurality of transistors is programmable.

20. A semiconductor die with distributed and configurable electrical overstress protection, the semiconductor die comprising:
  a plurality of pads including a signal pad, a power high pad, and a power low pad;
  a core circuit electrically connected to at least the signal pad, the power high pad, and the power low pad; and
  a configurable overstress protection array operable to protect the core circuit from electrical overstress at the plurality of pads, wherein the configurable overstress protection array includes a plurality of overstress protection devices of two or more different device types, wherein both a number of selected overstress protection devices and a device type of the selected overstress protection devices is programmable,
  wherein the core circuit comprises a pass gate circuit including a plurality of transistors and a plurality of ballast resistors, wherein each of the ballast resistors is interposed between the signal pad and a corresponding one of the plurality of transistors.

* * * * *